US009219116B2

(12) United States Patent
Ching et al.

(10) Patent No.: US 9,219,116 B2
(45) Date of Patent: Dec. 22, 2015

(54) FIN STRUCTURE OF SEMICONDUCTOR DEVICE

(71) Applicant: Taiwan Semiconductor Manufacturing Company, Ltd., Hsin-Chu (TW)

(72) Inventors: Kuo-Cheng Ching, Zhubei (TW); Chih-Hao Wang, Baoshan Township (TW); Zhiqiang Wu, Chubei (TW); Carlos H. Diaz, Mountain View, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/319,987

(22) Filed: Jun. 30, 2014

(65) Prior Publication Data

US 2015/0200252 A1  Jul. 16, 2015

Related U.S. Application Data

(63) Continuation-in-part of application No. 14/155,793, filed on Jan. 15, 2014.

(51) Int. Cl.
*H01L 21/336* (2006.01)
*H01L 29/06* (2006.01)
*H01L 21/762* (2006.01)

(52) U.S. Cl.
CPC ...... *H01L 29/0649* (2013.01); *H01L 21/76224* (2013.01)

(58) Field of Classification Search
None
See application file for complete search history.

(56) References Cited

U.S. PATENT DOCUMENTS

| 6,359,311 | B1 | 3/2002 | Colinge et al. |
| 7,323,375 | B2 * | 1/2008 | Yoon et al. ............... 438/164 |
| 2013/0200454 | A1 * | 8/2013 | Anderson et al. ........... 257/347 |

OTHER PUBLICATIONS

Gas, P., et al, "Diffusion of Sb, Ga, Ge, and (As) in TiSi2," Journal of Applied Physics, vol. 63, No. 11, Jun. 1, 1998, pp. 5335-5345.
Tetelin, C., et al., "Kinetics and mechanism of low temperature atomic oxygen-assisted oxidation of SiGe layers," Journal of Applied Physics, vol. 83, No. 5, Mar. 1, 1998, pp. 2842-2846.

* cited by examiner

*Primary Examiner* — Sonya D McCall Shepard
(74) *Attorney, Agent, or Firm* — Slater & Matsil, L.L.P.

(57) ABSTRACT

A semiconductor device and method of formation are provided herein. A semiconductor device includes a fin having a first wall extending along a first plane, the fin including a doped region defining a first furrow on a first side of the first plane. A dielectric is disposed within the first furrow, such that the dielectric is in contact with the first furrow between a first end of the dielectric and a second end of the dielectric. The first end is separated a first distance from the first plane. The dielectric disposed within the furrow increases the isolation of a channel portion of adjacent fins, and thus decreases current leakage of a FinFET, as compared to a FinFET including fins that do not include a dielectric disposed within a furrow.

20 Claims, 42 Drawing Sheets

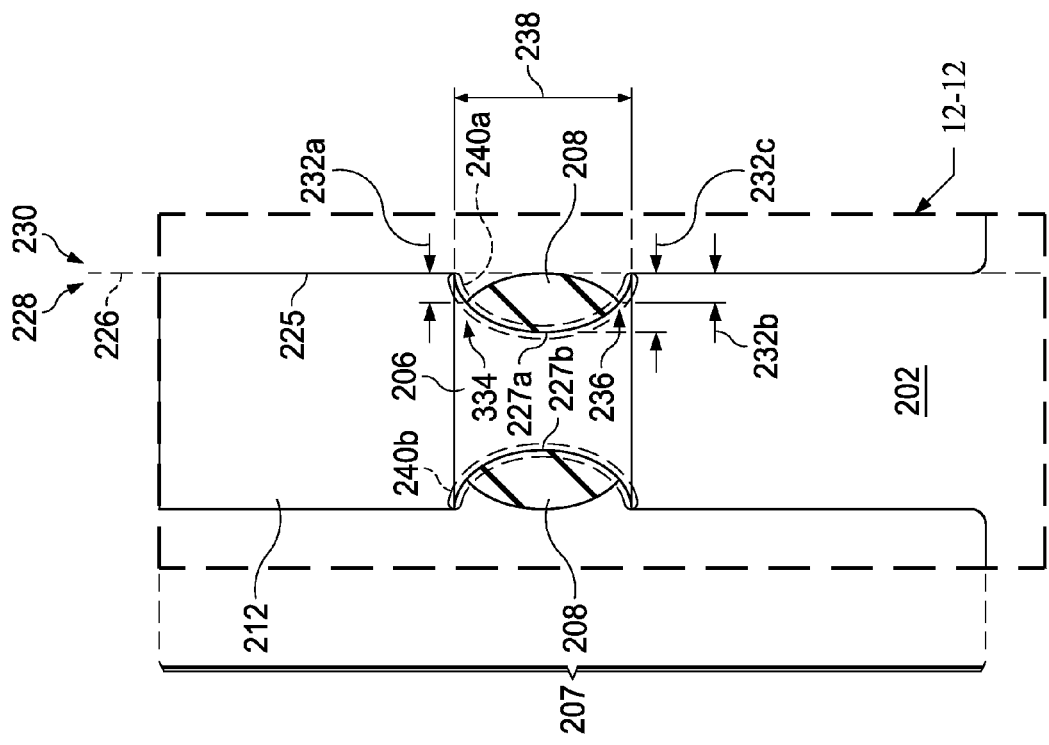
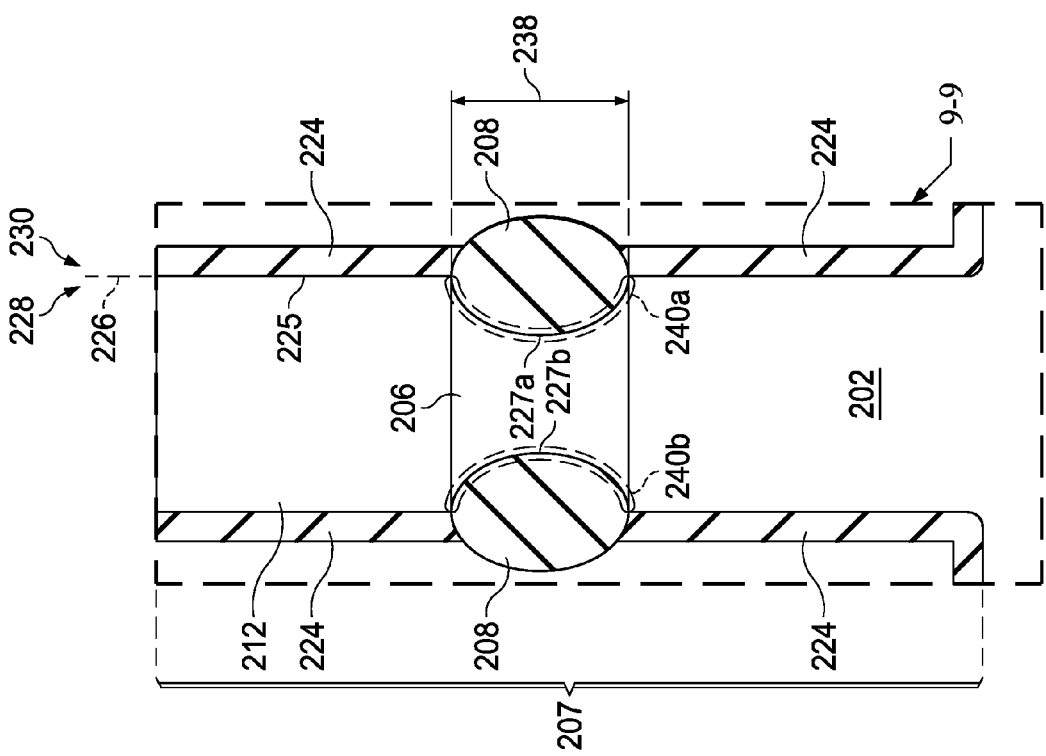

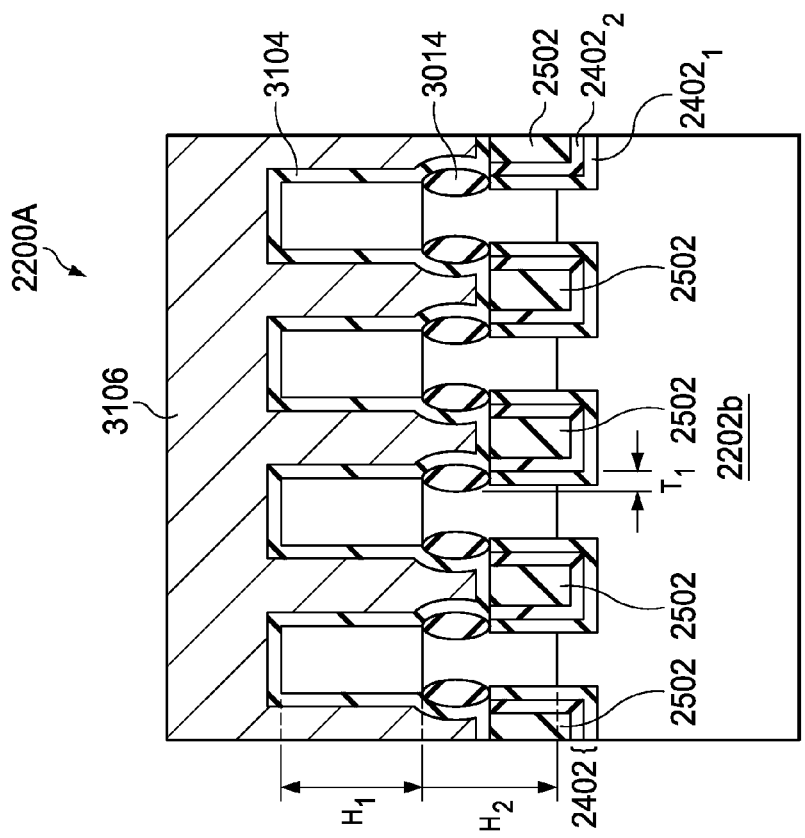
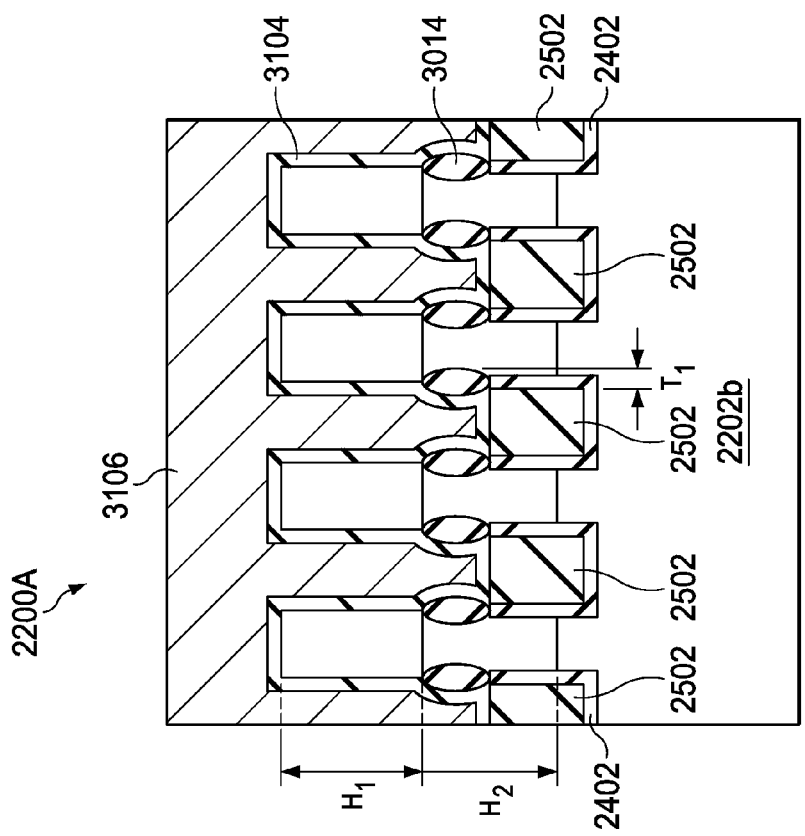

FIN STRUCTURE OF SEMICONDUCTOR DEVICE

PRIORITY CLAIM AND CROSS-REFERENCE

This application is a continuation-in-part of, and claims the benefit of, U.S. patent application Ser. No. 14/155,793, filed on Jan. 15, 2014, titled "Semiconductor Device and Formation Thereof," which is hereby incorporated herein by reference.

BACKGROUND

In a semiconductor device, current flows through a channel region between a source region and a drain region upon application of a sufficient voltage or bias to a gate of the device. When current flows through the channel region, the device is generally regarded as being in an 'on' state, and when current is not flowing through the channel region, the device is generally regarded as being in an 'off' state.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-20 are illustrations of a semiconductor device, in accordance with some embodiments.

DETAILED DESCRIPTION

Figure 1:
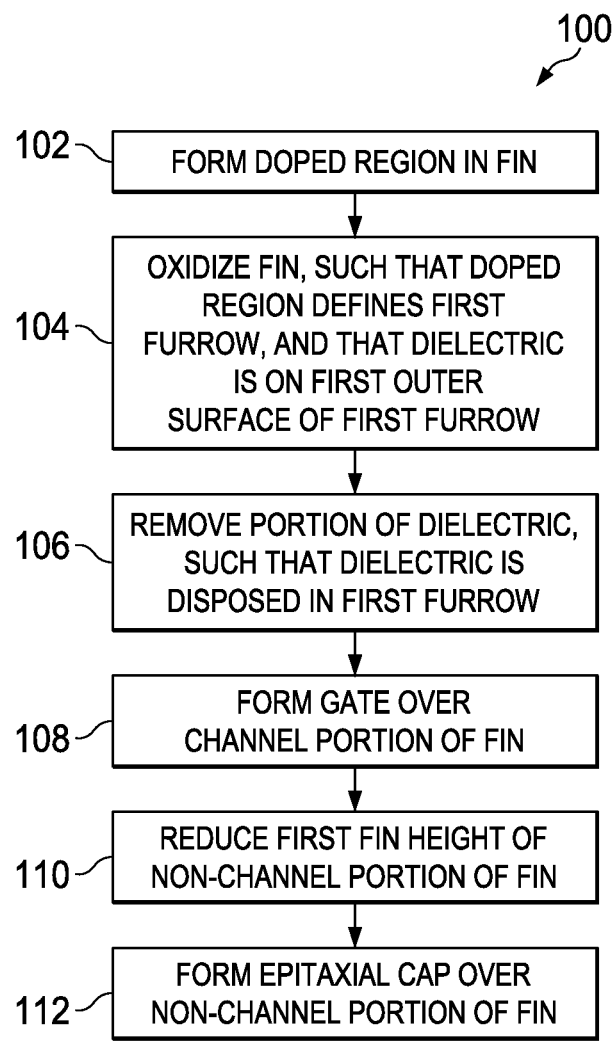
FIG. 1 is a flow diagram illustrating a method of forming a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more techniques for forming a semiconductor device and resulting structures formed thereby are provided herein.

Figure 2:
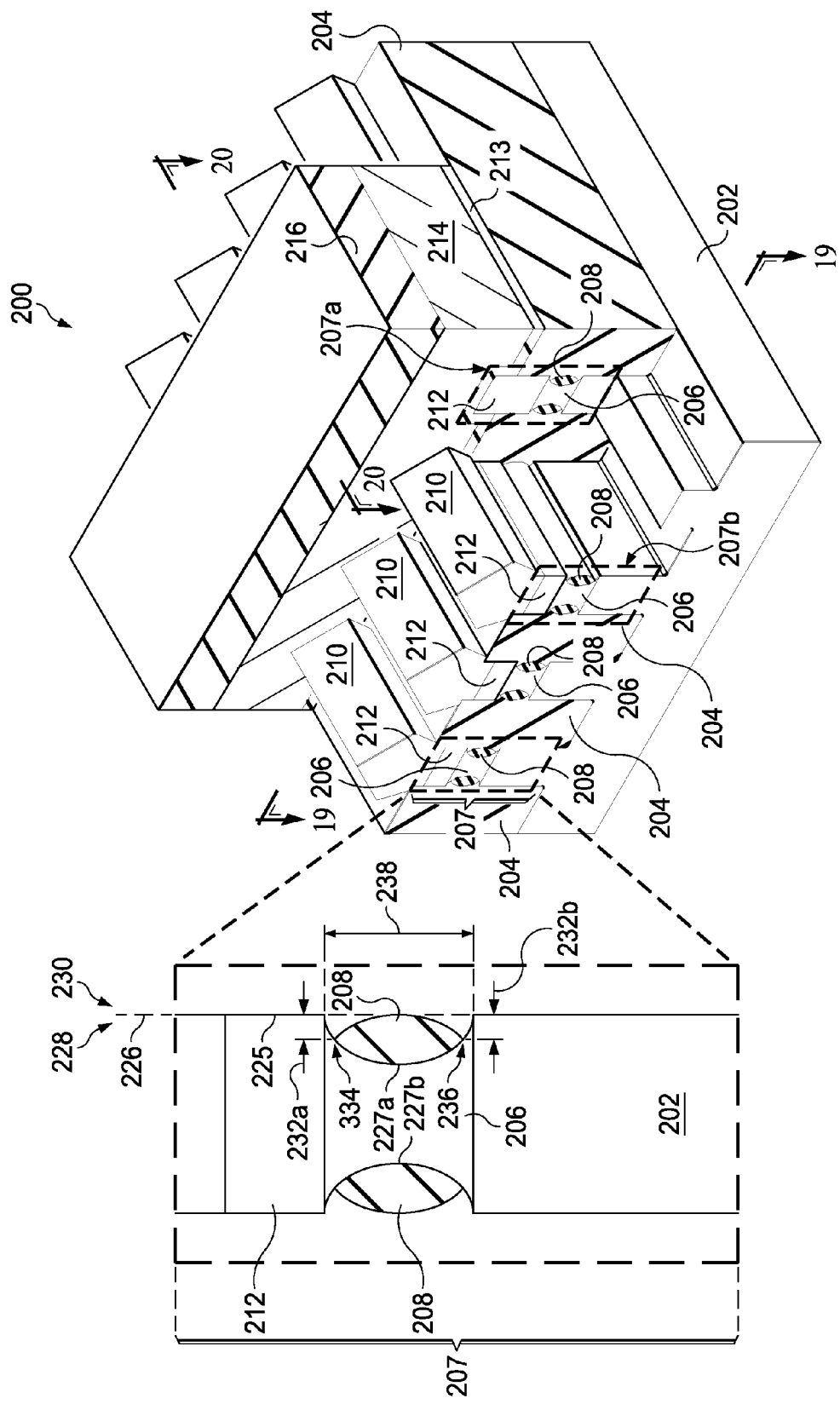
Figure 19:
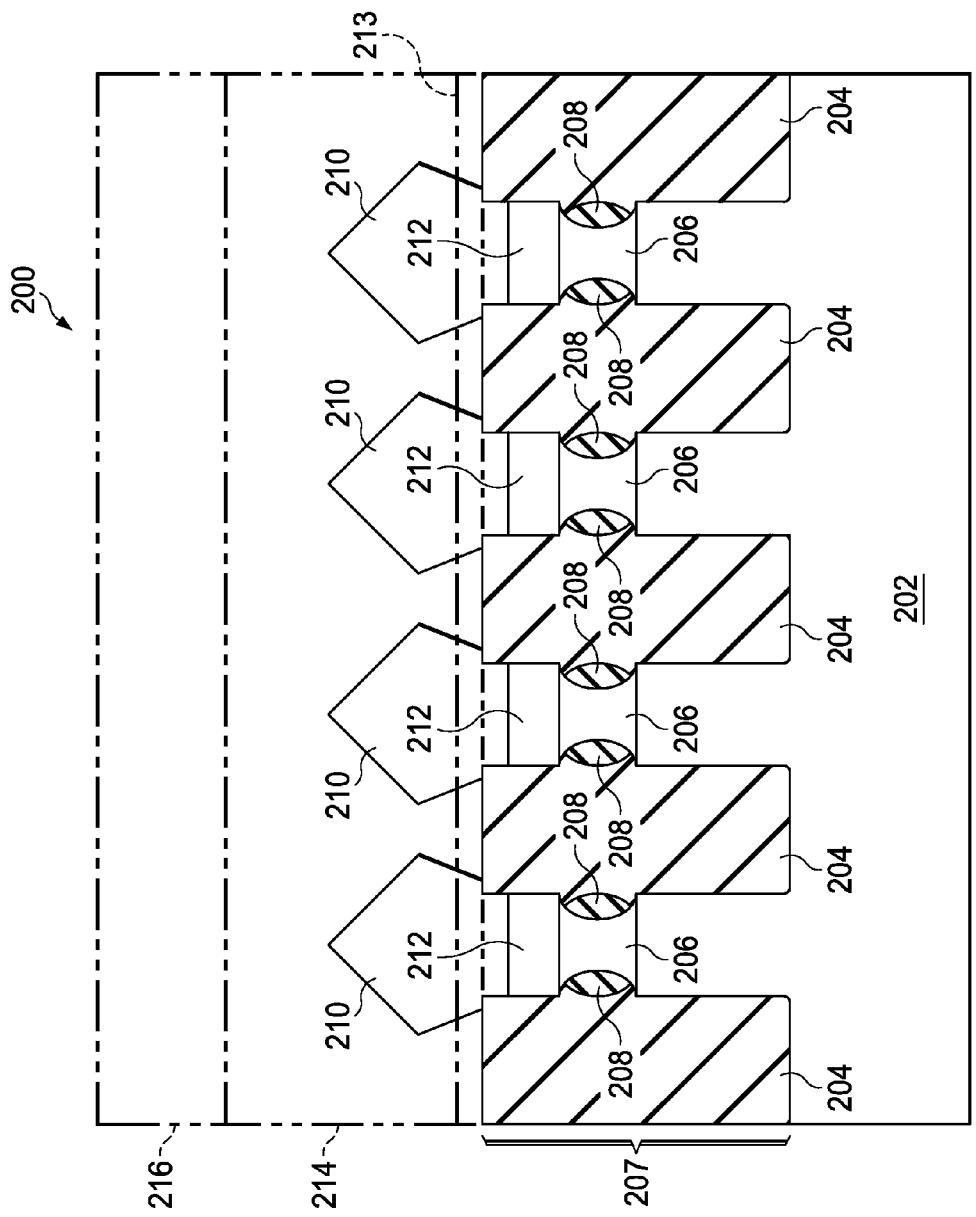
Figure 20:
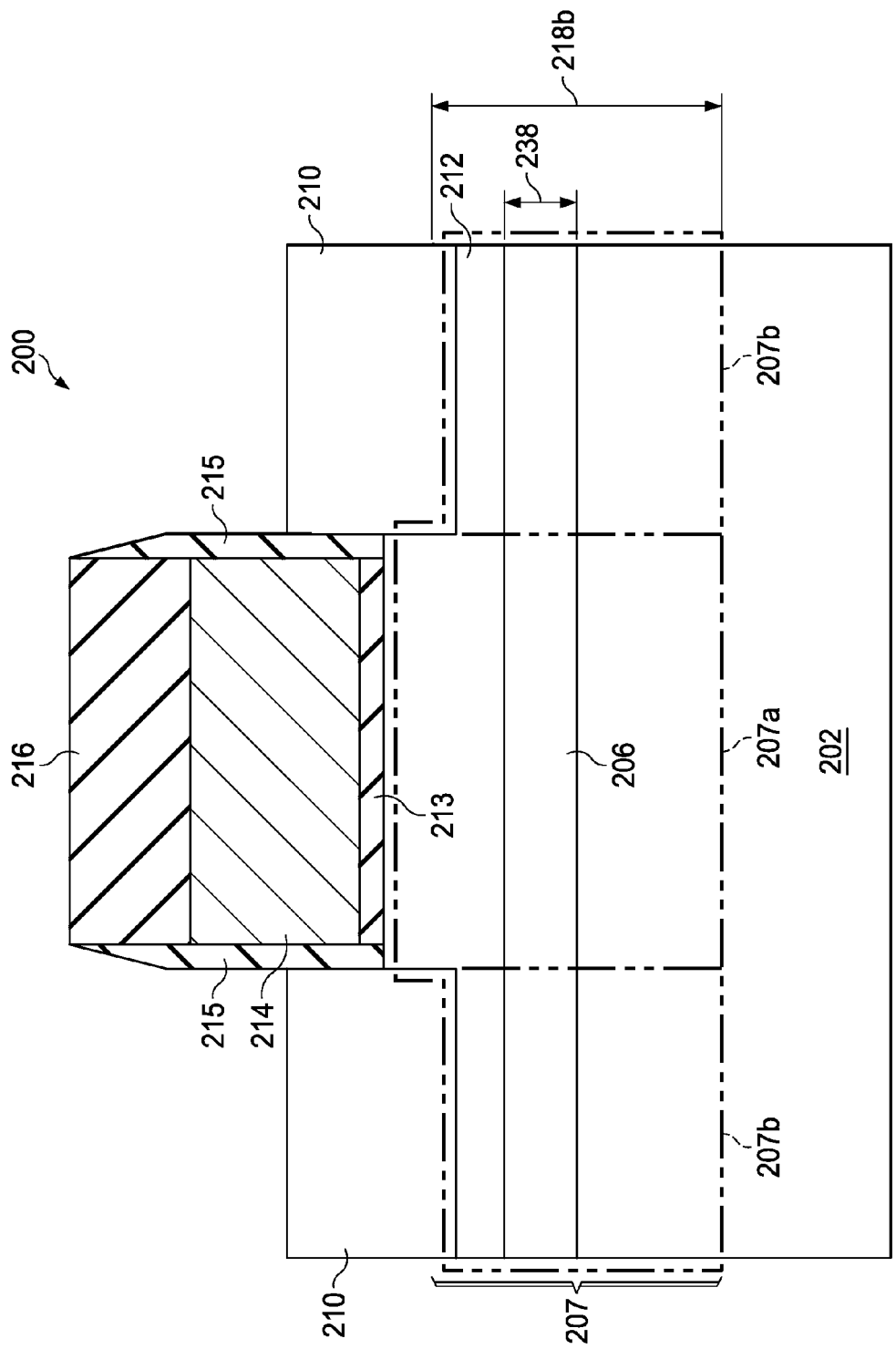

A method 100 of forming a semiconductor device 200 according to some embodiments is illustrated in FIG. 1 and one or more structures formed thereby at various stages of fabrication are illustrated in FIGS. 2-20. According to some embodiments, such as illustrated in FIG. 2, which illustrates a 3D rendering of the semiconductor device 200 and a magnified fin 250, where sidewalls 215, as illustrated in FIGS. 16, 18 and 20 are not shown, so that features underlying the sidewalls 215 are visible. In some embodiments, the magnified fin 250 illustrates a magnified or zoomed in illustration of the fin 207 encompassed by a dashed box. In FIG. 2, a semiconductor device 200 comprises a fin 207, the fin 207 comprising a doped region 206 and a dielectric 208, according to some embodiments. In some embodiments, STI 204 is adjacent the fin 207, and an epitaxial (epi) cap 210 is over a non-channel portion 207b of the fin 207. In some embodiments, a gate dielectric 213 is formed over a channel portion 207a of the fin 207. In some embodiments, a gate 214 is formed over the gate dielectric 213, and a hard mask 216 is formed over the gate 214. In some embodiments, such as shown in the magnified fin 250, the fin 207 has a first wall 225 extending along a first plane 226. In some embodiments, the doped region 206 defines a first furrow 227a on a first side 228 of the first plane 226. In some embodiments, the dielectric 208 is disposed within the first furrow 227a such that the dielectric 208 is in contact with the first furrow 227a between a first end 234 of the dielectric 208 and a second end 236 of the dielectric 208. In some embodiments, the first end 334 is separated a first distance 232a from the first plane 226. In some embodiments, the second end 236 is separated a second distance 232b from the first plane 226, the second distance 232b substantially equal to the first distance 232a. In some embodiments, the configuration of the dielectric 208 over the doped region 206 inhibits current leakage between adjacent fins 207. In FIG. 2 a line 19-19 is drawn to illustrate a cross-section that is depicted in FIG. 19, according to some embodiments. In FIG. 2 a line 20-20 is drawn to illustrate a cross-section that is depicted in FIG. 20, according to some embodiments. In some embodiments, the line 19-19, cuts through the epi caps 210 and the non-channel portion 207b of the fin 207. FIGS. 3, 5, 7, 10, 13, 15, 17 and 19 are cross sectional views of the semiconductor device 200 taken along the line 19-19 at various stages of fabrication. In some embodiments, the line 20-20, cuts through the hard mask 216, the gate 214, the gate dielectric 213, the epi cap 210, the non-channel portion 207b of the fin 207, and the channel portion 207a of the fin. FIGS. 4, 6, 8, 11, 14, 16, 18 and 20 are cross sectional views of the semiconductor device 200 taken along the line 19-19 at various stages of fabrication.

Figure 3:
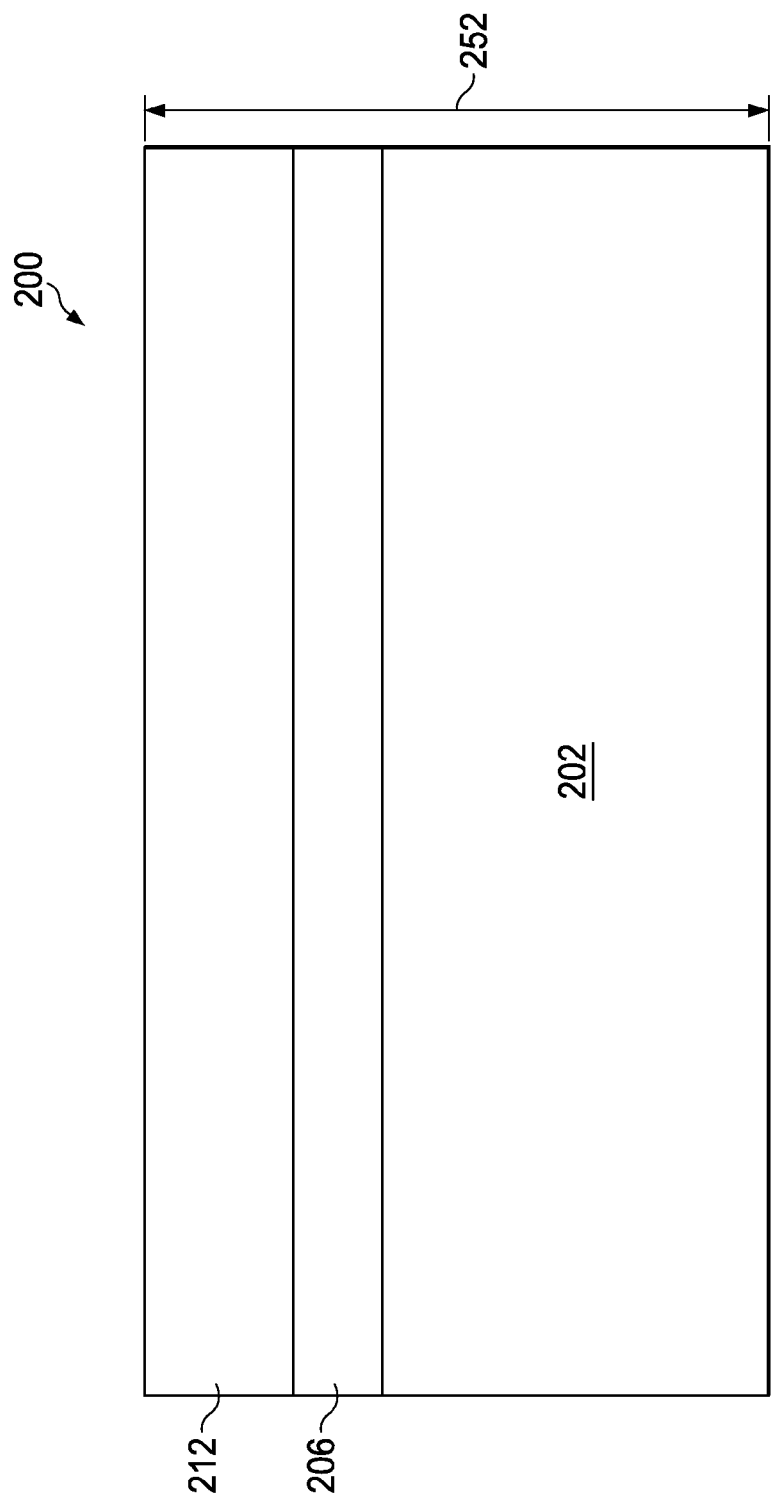
Figure 4:
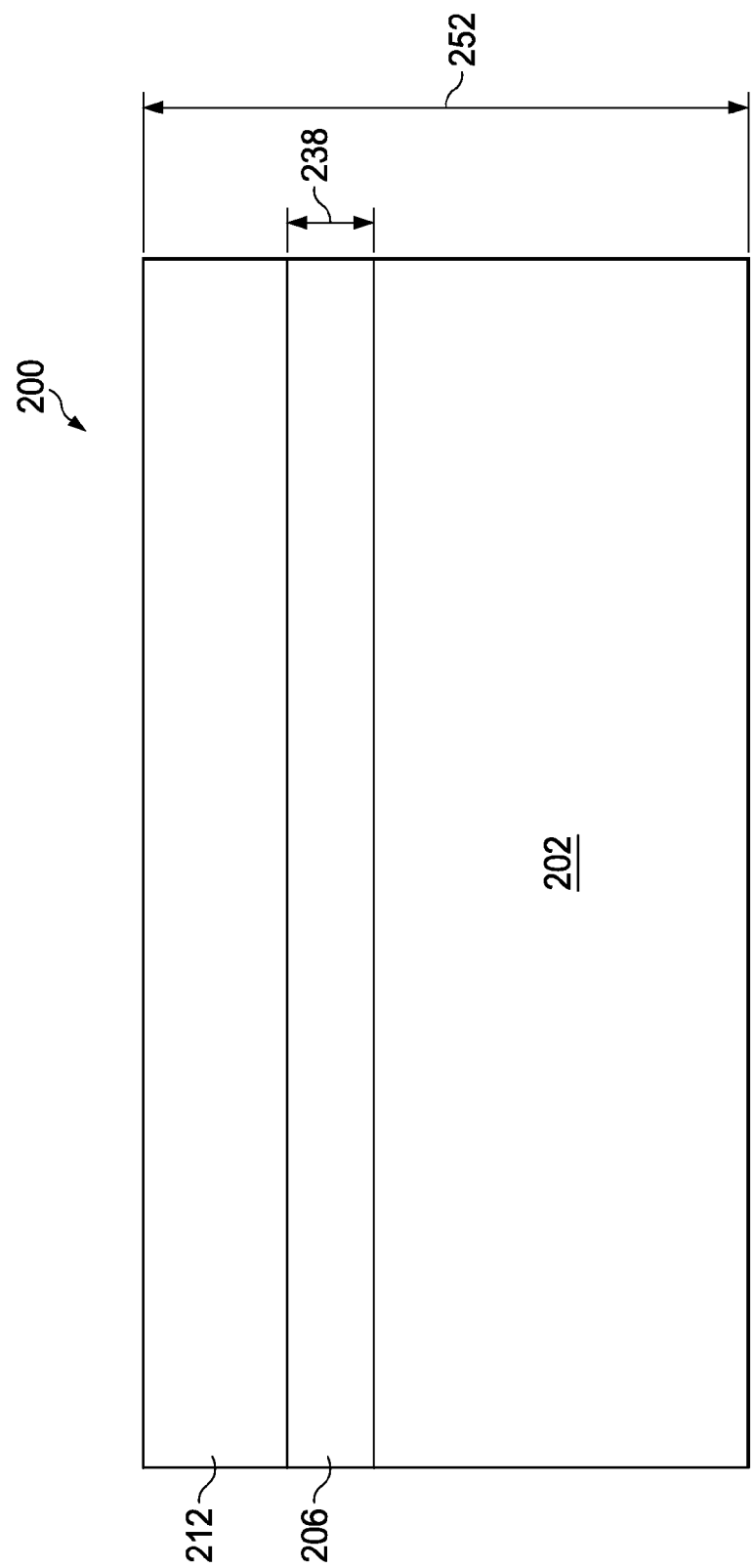
Figure 5:
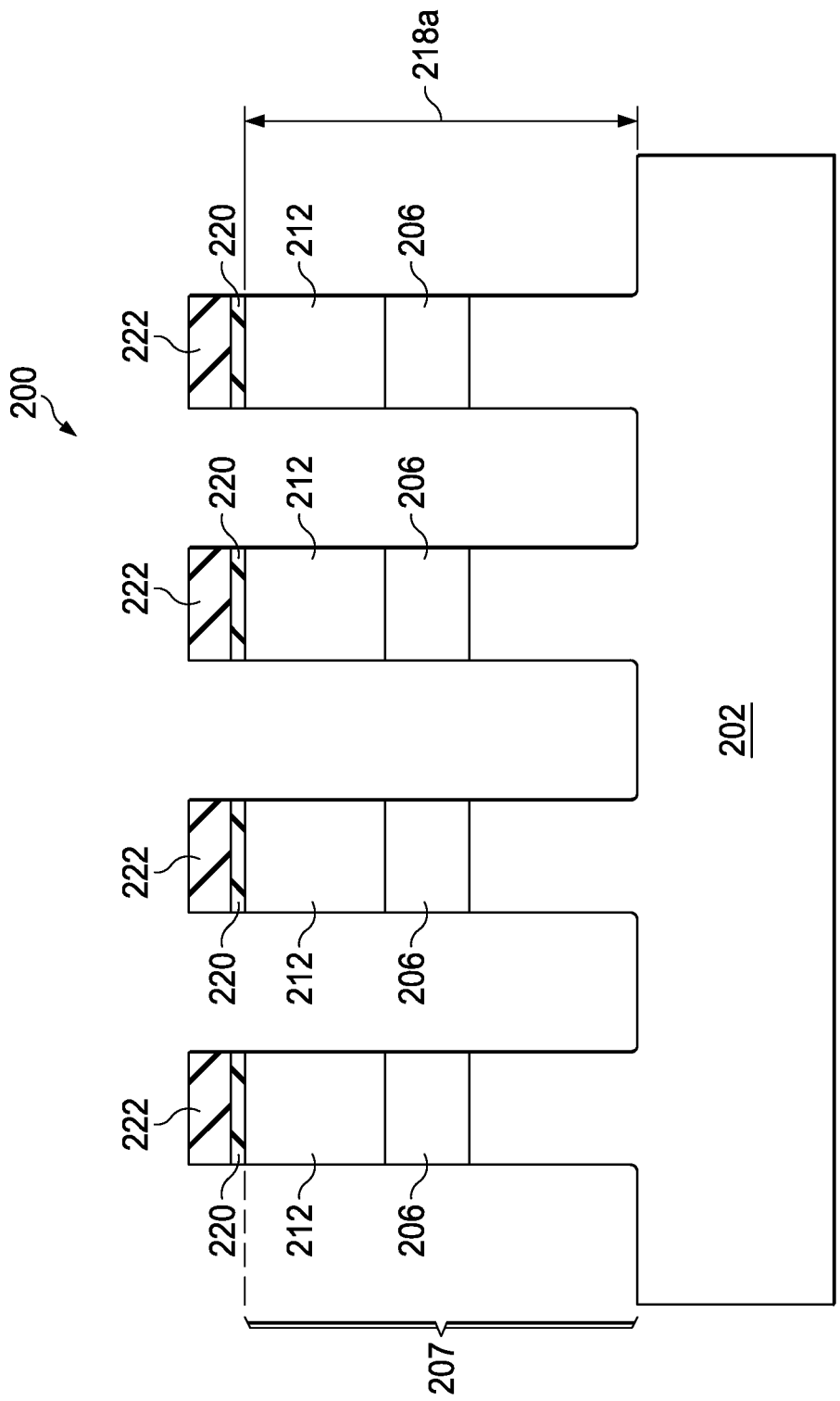
Figure 6:
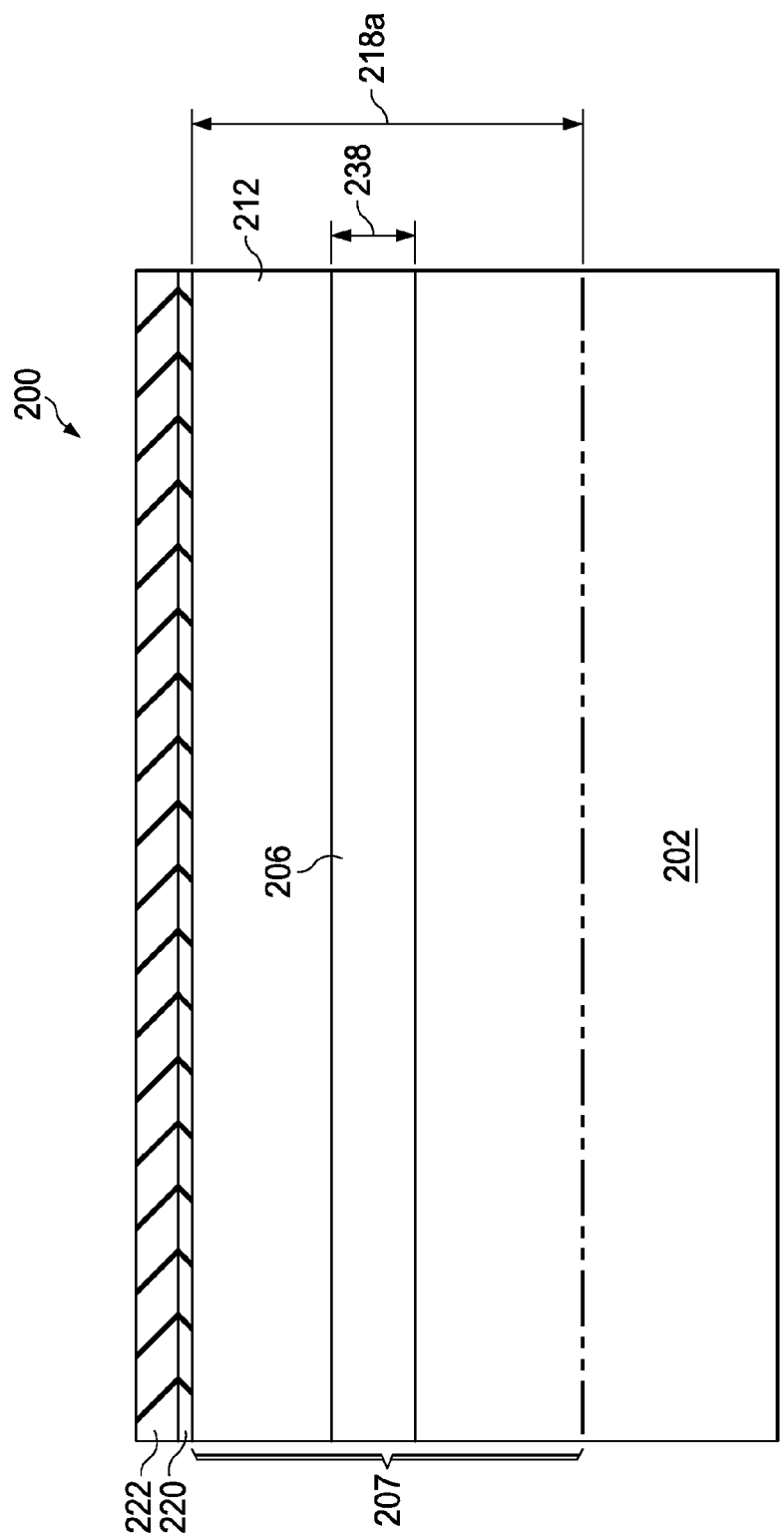

At 102, the doped region 206 is formed in the fin 207, as illustrated in FIGS. 5-6, according to some embodiments. Turning to FIGS. 3-4, prior to FIGS. 5-6, a doped region 206 is formed over a substrate 202, according to some embodiments. In some embodiments, the substrate 202 comprises silicon. According to some embodiments, the substrate 202 comprises at least one of an epitaxial layer, a silicon-on-insulator (SOI) structure, a wafer, or a die formed from a wafer. In some embodiments, the substrate 202 comprises at least one of a first conductivity type or a second conductivity type. In some embodiments, the first conductivity type is at least one of a p-type or an n-type. In some embodiments, the second conductivity type is p-type if the first conductivity type is n-type and the second conductivity type is n-type if the first conductivity type is p-type. In some embodiments, the doped region 206 is grown. In some embodiments, the doped region 206 has a doped region height 238 between about 25 nm to about 45 nm. In some embodiments, the doped region 206 comprises at least one of silicon or germanium. In some embodiments, a second substrate layer 212 is formed over the doped region 206. In some embodiments, the second substrate layer 212 comprises silicon. In some embodiments, the second substrate layer 212 is formed by at least one of growth or deposition. In some embodiments, the second substrate layer 212 comprises at least one of the first conductivity type or the second conductivity type. In some embodiments, the second substrate layer 212 has a second substrate height between about 40 nm to about 100 nm. In some embodiments, a stack height 252 of the substrate 202, the doped region 206 and the second substrate layer 212 is between about 200 nm to about 500 nm. In some embodiments, a mask layer 220 is formed over the second substrate layer 212, as illustrated in FIGS. 5-6. In some embodiments, the mask layer 220 comprises an oxide. In some embodiments, the mask layer 220 has a thickness between about 1 nm to about 6 nm. In some embodiments, a fin hard mask 222 is formed over the mask layer 220. In some embodiments, the fin hard mask 222 comprises nitride. In some embodiments, the fin hard mask 222 has a thickness between about 15 nm to about 25 nm. In some embodiments, the fin 207 or multiple fins are formed, such as by etching, as illustrated in FIG. 5, where the fin hard mask 222 and the mask layer 220 are patterned to protect or define the fin during the etching. In some embodiments, the fin 207 has a first fin height 218a between about 140 nm to about 260 nm.

Figure 7:
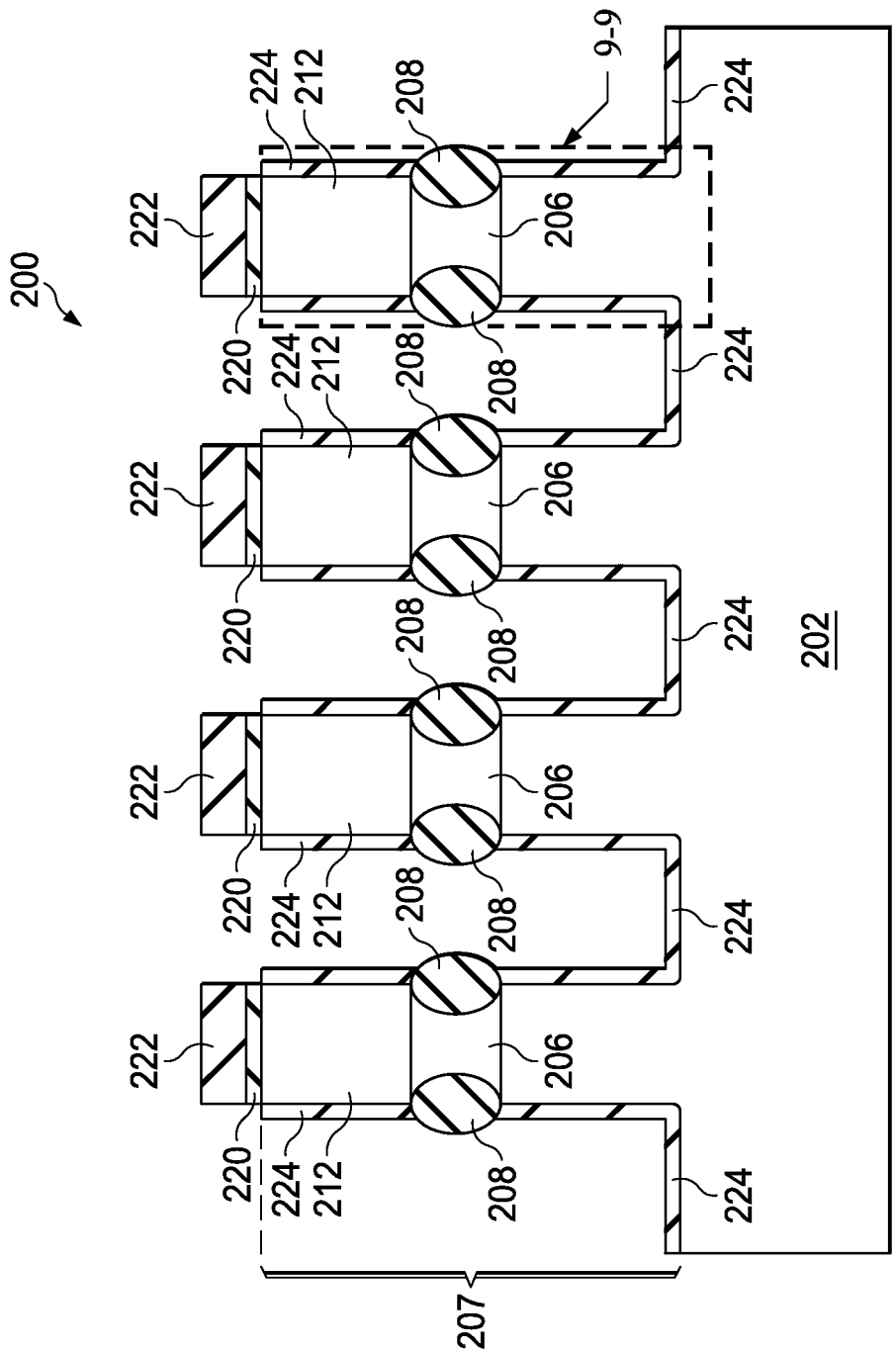
Figure 8:
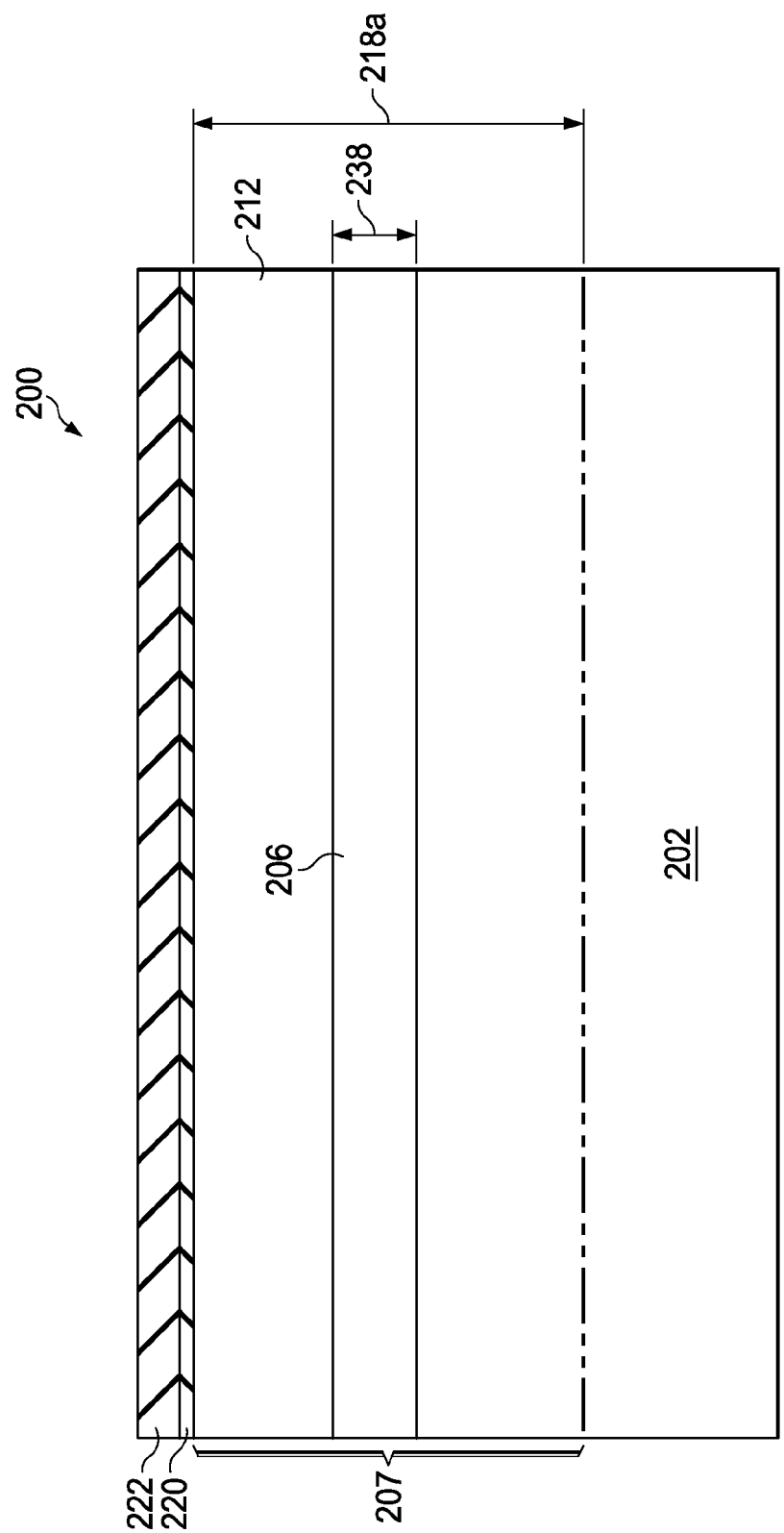

At 104, the fin 207 is oxidized, such that the doped region 206 defines the first furrow 227a and that the dielectric 208 is on a first outer surface 240a of the first furrow 227a, as illustrated in FIG. 9, which illustrates a magnified fin, the magnified fin illustrates a magnified or zoomed in illustration of the fin 207 encompassed by the dashed box 9-9 illustrated in FIG. 7. In some embodiments, the fin 207 is oxidized, such that the doped region 206 defines a second furrow 227b and such that the dielectric 208 is on a second outer surface 240b of the second furrow 227b. In some embodiments, the fin 207 is oxidized, such as by thermal oxidation. In some embodiments, thermal oxidation comprises applying H$_2$O gas at a temperature between about 500° C. to about 1000° C. to the semiconductor device 200. In some embodiments, such as illustrated in FIGS. 7 and 9, a surface of the substrate 202 and a surface of the second substrate layer 212 are oxidized such that an oxidation layer 224 comprising silicon and oxide is on the surface of the substrate 202 and the surface of the second substrate layer 212. In some embodiments, the oxidation layer 224 has a thickness between about 0.5 nm to about 3 nm. In some embodiments, the dielectric 208 comprises oxide and at least one of silicon or germanium. In some embodiments, the dielectric 208 is convex and extends from the first furrow 227a such that the dielectric 208 extends to a second side 230 of the first plane 226, as illustrated in FIG. 9. In some embodiments, convex means a configuration comprising an external angle greater than about 180°.

Figure 10:
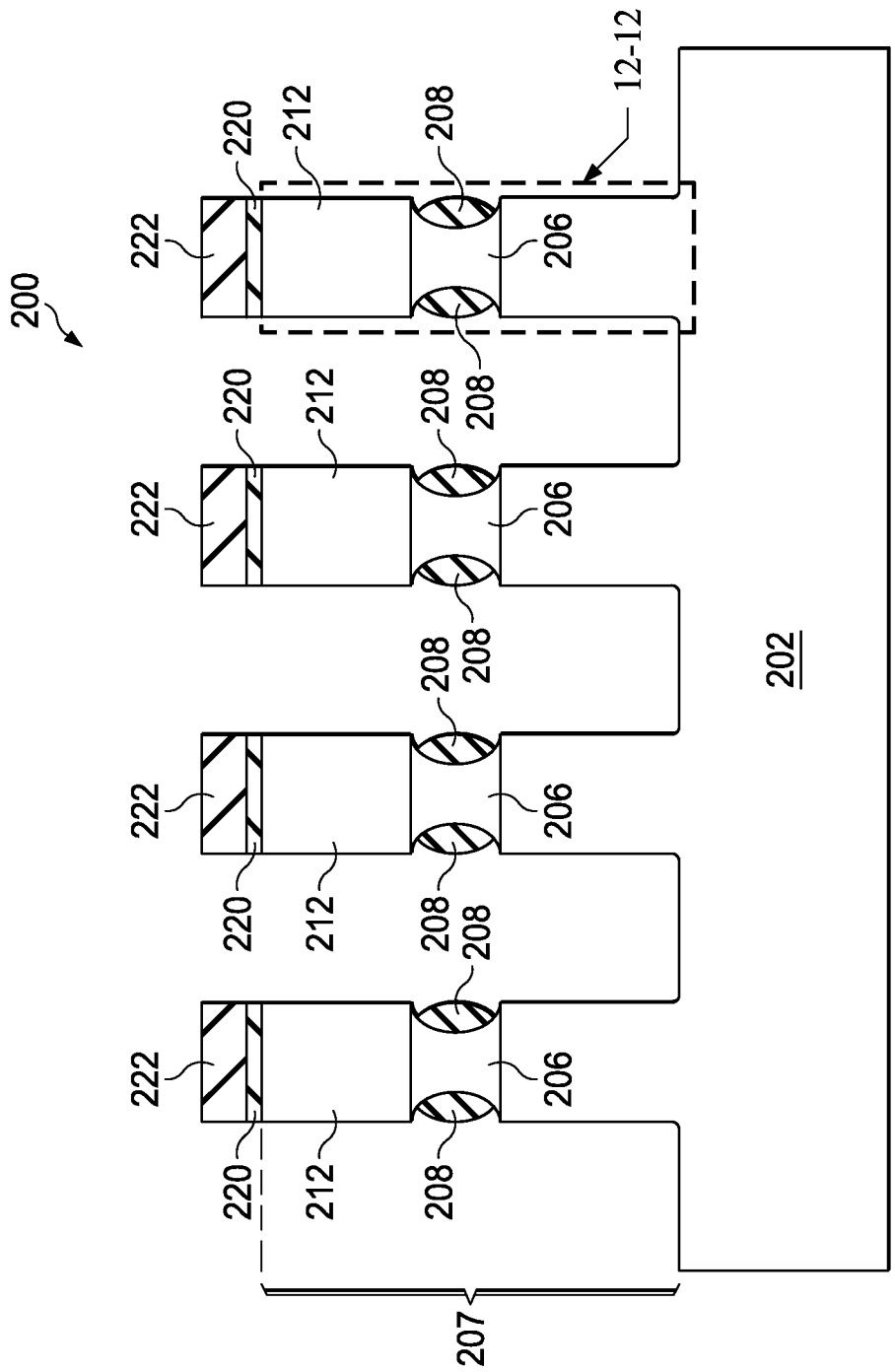
Figure 11:
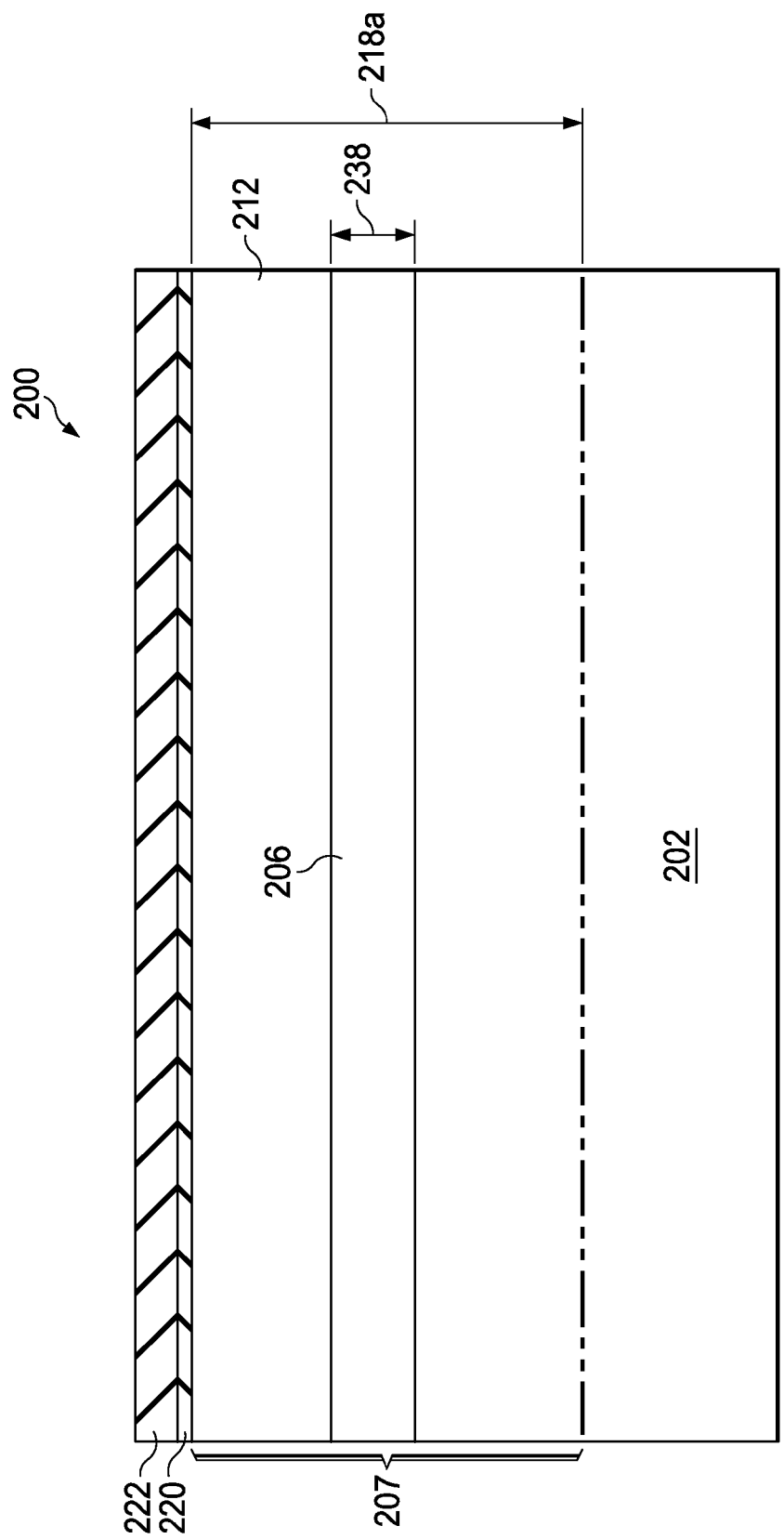
Figure 13:
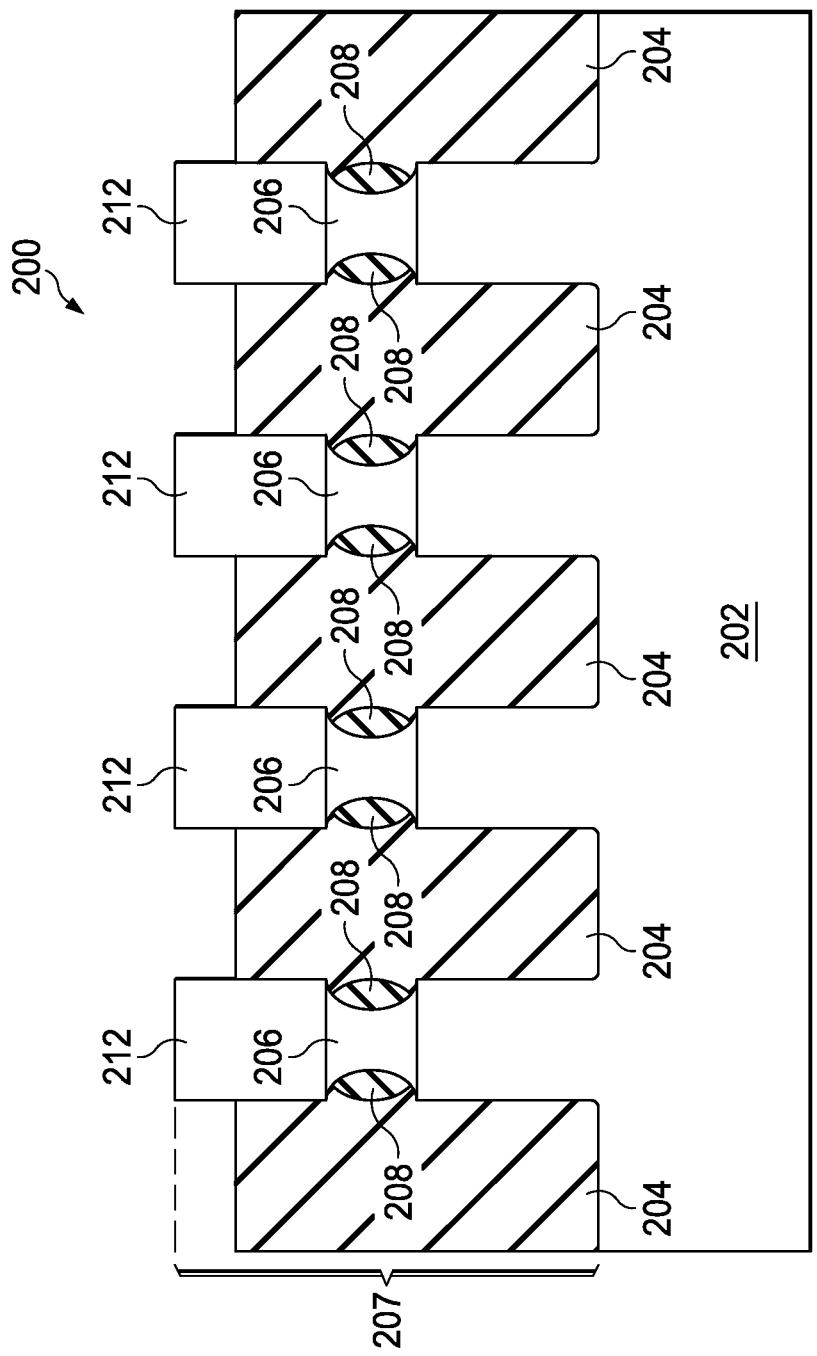
Figure 14:
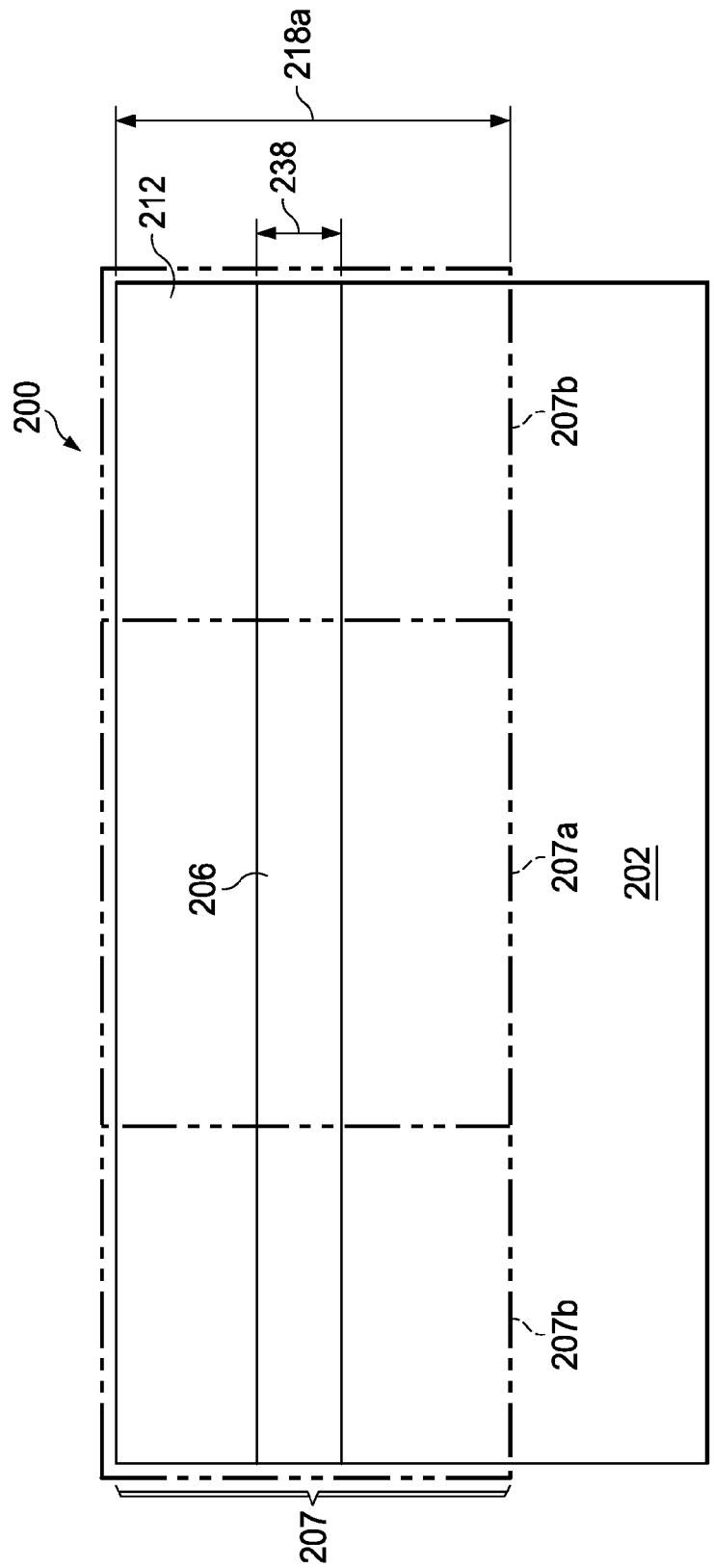

At 106, a portion of the dielectric 208 is removed, such that the dielectric 208 is disposed in the first furrow 227a as illustrated in FIG. 12, which illustrates a magnified fin, the magnified fin illustrates a magnified or zoomed in illustration of the fin 207 encompassed by the dashed box 12-12 illustrated in FIG. 10. In some embodiments, the portion of dielectric 208 is removed by etching. In some embodiments, the dielectric 208 is disposed within the first furrow 227a such that the dielectric 208 is in contact with the first furrow 227a between a first end 234 of the dielectric 208 and a second end 236 of the dielectric 208. In some embodiments, the removal of the portion of the dielectric 208 exposes at least a portion of a first outer surface 240a. In some embodiments, the first end 234 is separated the first distance 232a from the first plane 226. In some embodiments, the second end 236 is separated the second distance 232b from the first plane 226. In some embodiments, the first distance 232a and the second distance 232b are substantially equal. In some embodiments, the first distance 232a is between about 0.5 nm to about 10 nm. In some embodiments, the dielectric 208 is convex, such that an outer most protruding point is at least one of even with the first plane 226, on the first side 228 of the first plane 226 or on a second side 230 of the first plane 226. In some embodiments, the dielectric 208 has a dielectric thickness 232c, the dielectric thickness 232c measured from a portion of the first furrow 227a nearest the second furrow 227b to the outer most protruding point of the dielectric 208. In some embodiments, the dielectric thickness 232c is between about 0.5 nm to about 10 nm. In some embodiments, the dielectric 208 is disposed in a second furrow 227b in substantially the same manner as the dielectric 208 is disposed in the first furrow 227a. In some embodiments, the oxidation layer 224 is removed, such as by etching, from the surface of the substrate 202 and from the surface of the second substrate layer 212, as illustrated in FIGS. 10 and 12. In some embodiments, the fin hard mask 222 and the mask layer 220 are removed, such as by etching after the oxidation layer 224 is removed, as illustrated in FIGS. 13-14. In some embodiments, STI 204 is formed between and over the fin 207, such that the STI 204 is on the surface of the substrate 202, the surface of the doped region 206 such as a portion of the furrow 227, a surface of the dielectric 208, and the surface of the second substrate layer 212. In some embodiments, the STI 204 comprises a high dielectric constant material, such as oxide. In some embodiments, the STI 204 is deposited, such as by deposition in a furnace. In some embodiments, the STI 204 is recessed, such as by a chemical etch comprising fluorine. In some embodiments, the STI 204 is recessed such that at least a top surface of the second substrate layer 212 is exposed.

Figure 15:
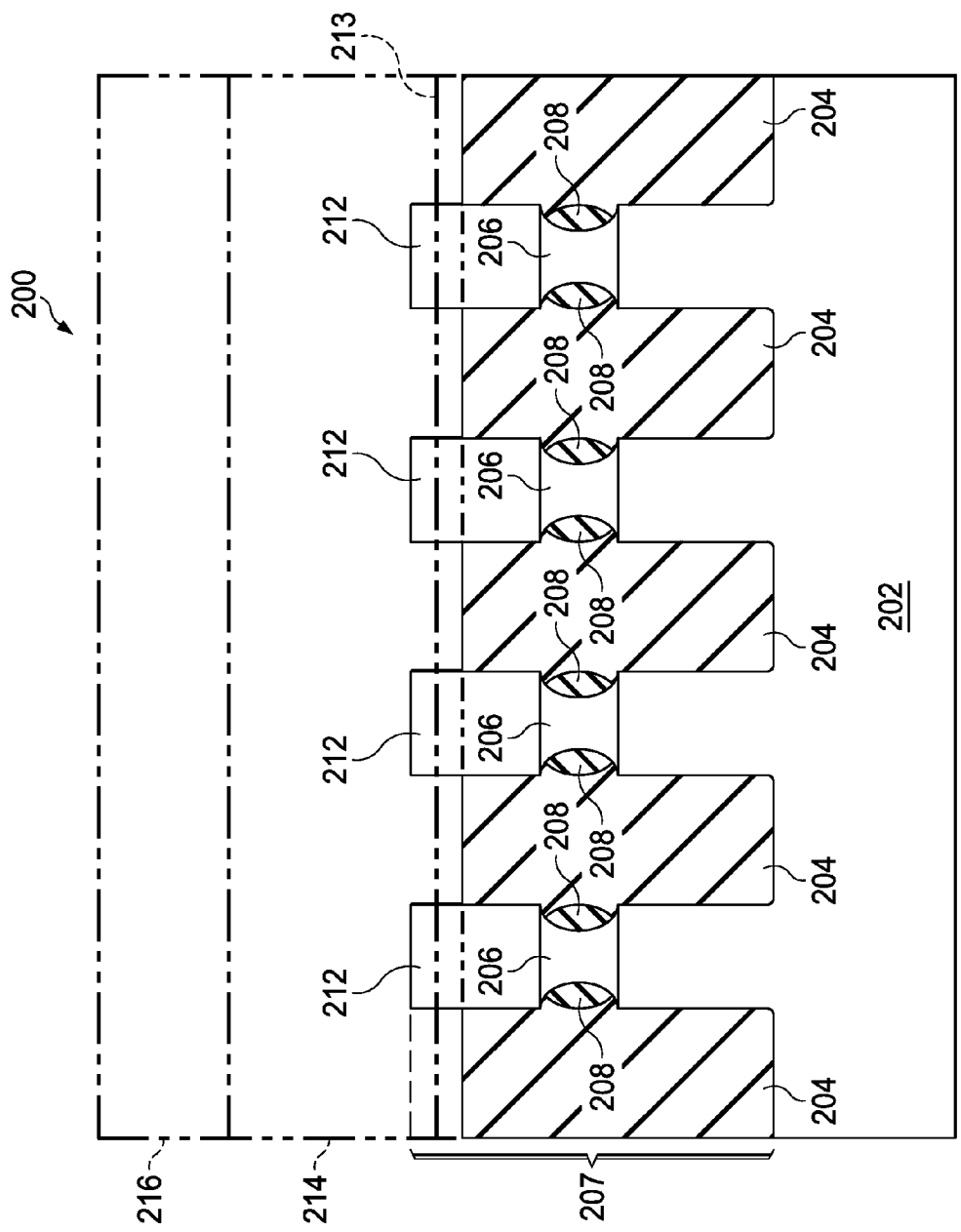
Figure 16:
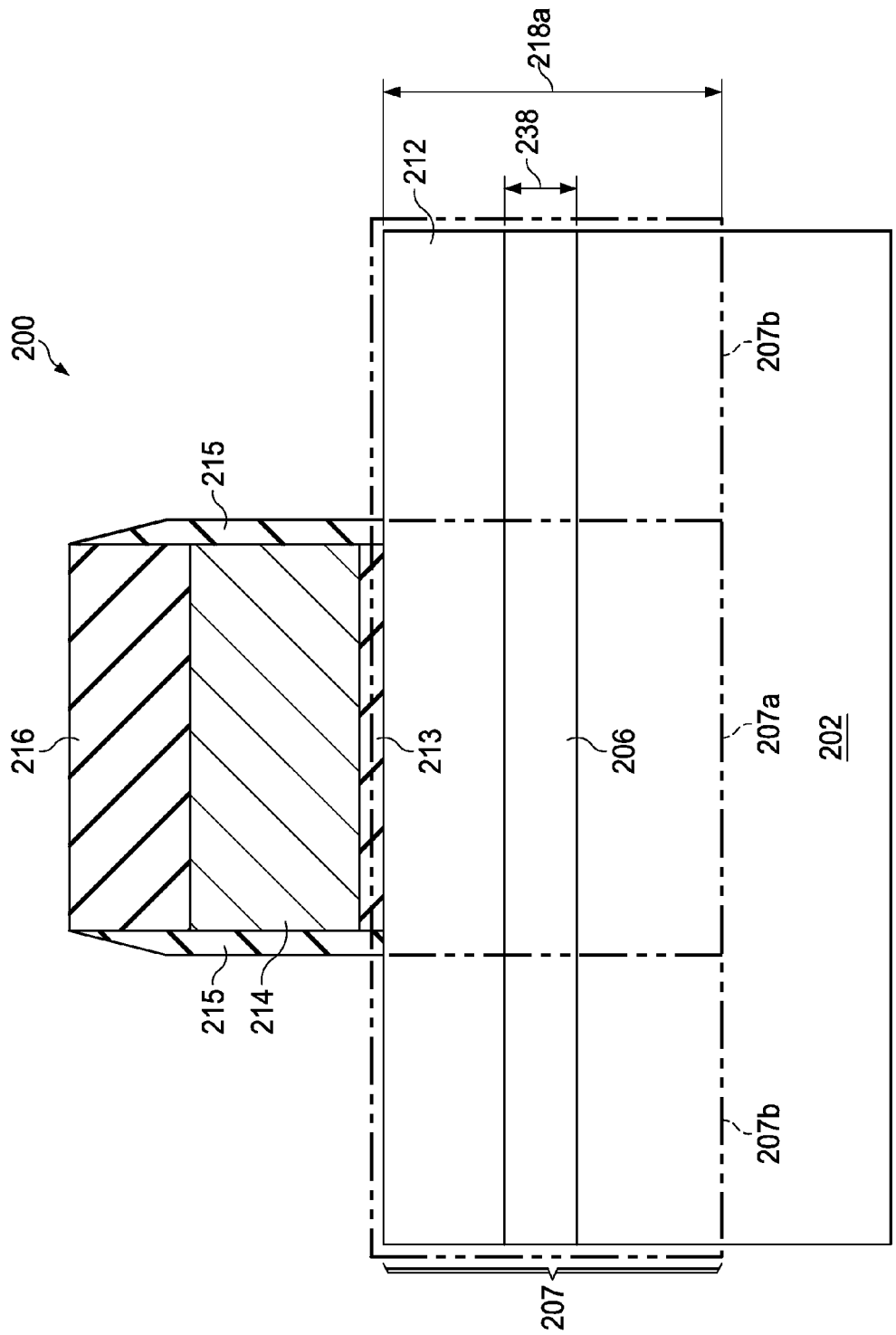

At 108, a gate 214 is formed over the channel portion 207a of the fin 207, as illustrated in FIGS. 15-16, according to some embodiments. In some embodiments, forming the gate 214 comprises forming, such as by deposition, a gate dielectric layer 213 over the fin 207. In some embodiments, the gate dielectric layer 213 comprises a high dielectric constant material. In some embodiments, a gate material is deposited over the gate dielectric layer 213. In some embodiments, the gate material comprises a conductive material, such as metal or polysilicon. In some embodiments, a hard mask 216 is formed over the gate material, such that the hard mask 216 is over the portion of the gate material on the channel portion 207a of the fin 207. In some embodiments, the hard mask 216 comprises oxide. In some embodiments, the gate material and the gate dielectric layer 213 are patterned such that a gate 214 is formed over the channel portion 207a of the fin 207, as illustrated in FIG. 16. In some embodiments, sidewalls 215 are formed on a first side of the gate dielectric layer 213 and the gate 214 and on a second side of the gate dielectric layer 213 and the gate 214.

Figure 17:
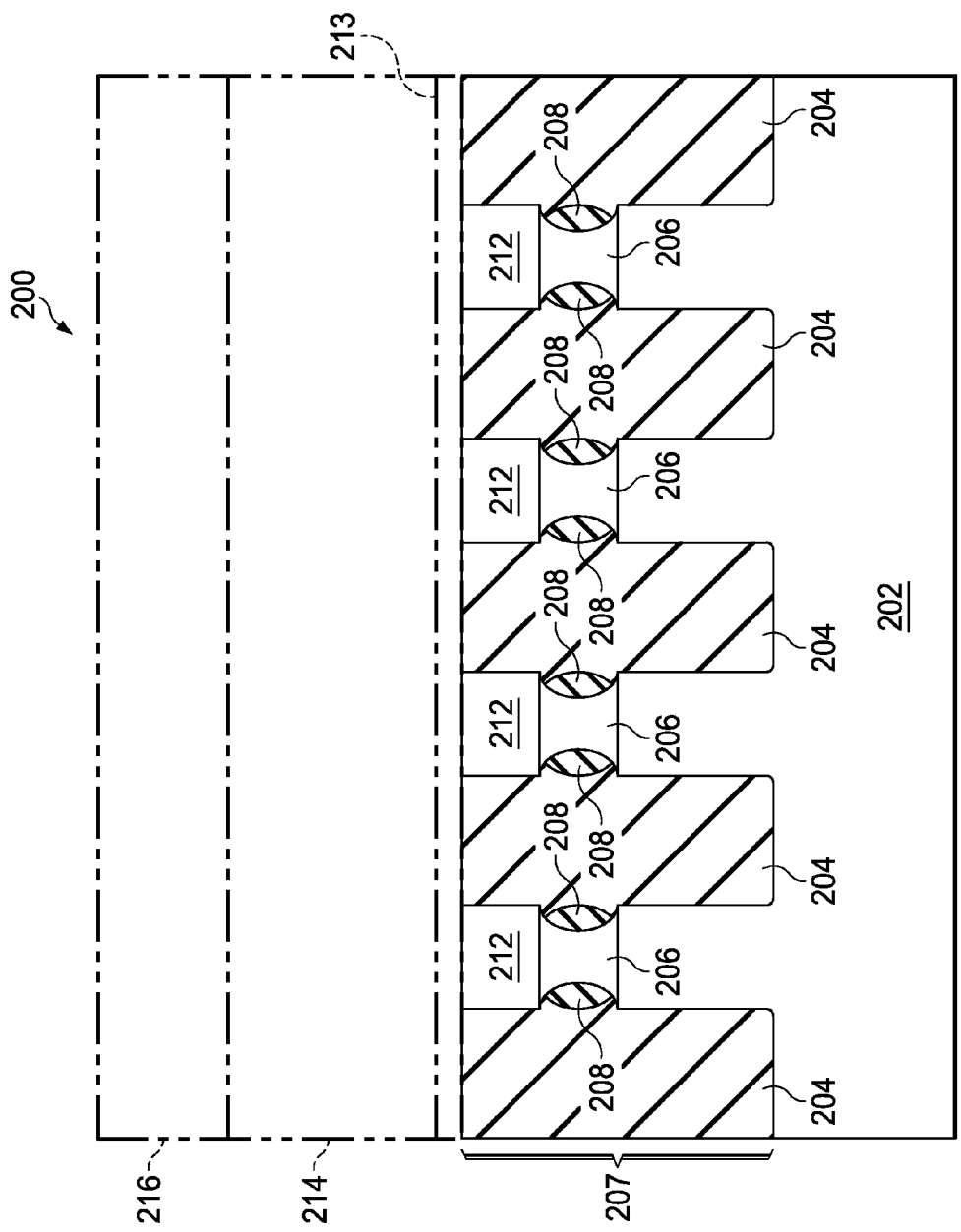
Figure 18:
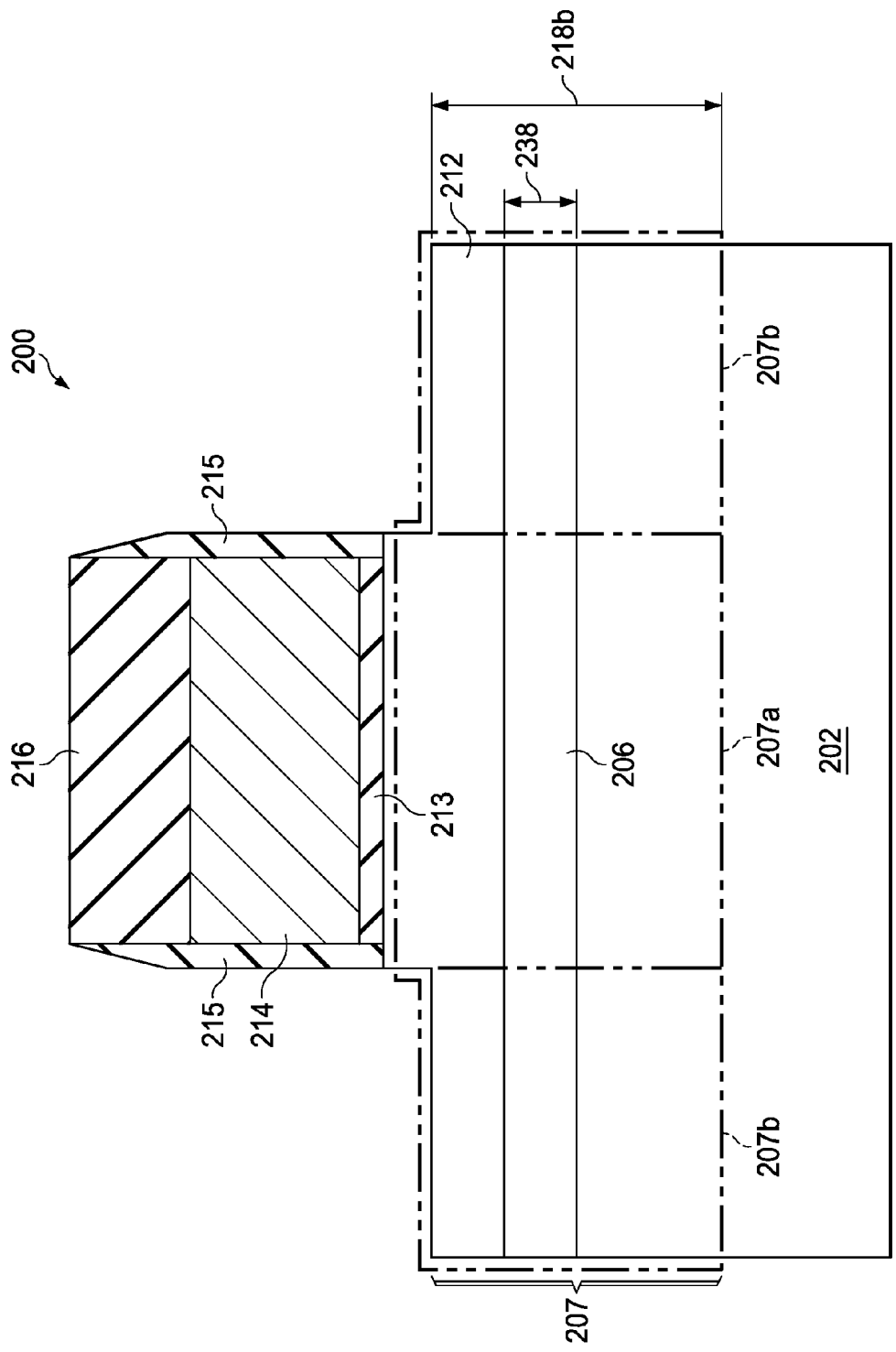

At 110, the first fin height 218a of the non-channel portion 207b of the fin 207 is reduced, as illustrated in FIGS. 17-18, according to some embodiments. In some embodiments, a second fin height 218b of the non-channel portion 207b of the fin 207 is between about 80 nm to about 200 nm. In some embodiments, the first fin height 218a of the non-channel portion 207b of the fin 207 is reduced by etching, such as dry etching. In some embodiments, the first height 218a of the non-channel portion 207b of the fin 207 is reduced such that the non-channel portion 207b of the fin 207 is at least one of below a top surface of the STI 204, even with the top surface of the STI 204, or above the top surface of the STI 204.

At 112, the epi cap 210 is formed over the non-channel portion 207b of the fin 207, such as illustrated in FIGS. 19-20, according to some embodiments. In some embodiments, the epi cap 210 is adjacent the gate 214. In some embodiments, the epi cap 210 is grown, such as by epitaxial growth. In some embodiments, the epi cap 210 comprises at least one of a source or a drain. In some embodiments, the epi cap 210 comprises at least one of silicon or germanium. In some embodiments, the epi cap 210 comprises at least one of the first conductivity type or the second conductivity type. In some embodiments, the epi cap 210 has an epi cap height measured from a top most portion of the epi cap 210 to a top surface of the fin 207. In some embodiments, the epi cap height is between about 20 nm to about 50 nm. In some embodiments, the dielectric 208 disposed within the furrow 227 increases isolation of the channel portion 207a of adjacent fins 207, and thus decreases current leakage of a FinFet, as compared to a FinFet comprising fins that do not comprise the dielectric disposed within a furrow.

Figure 21:
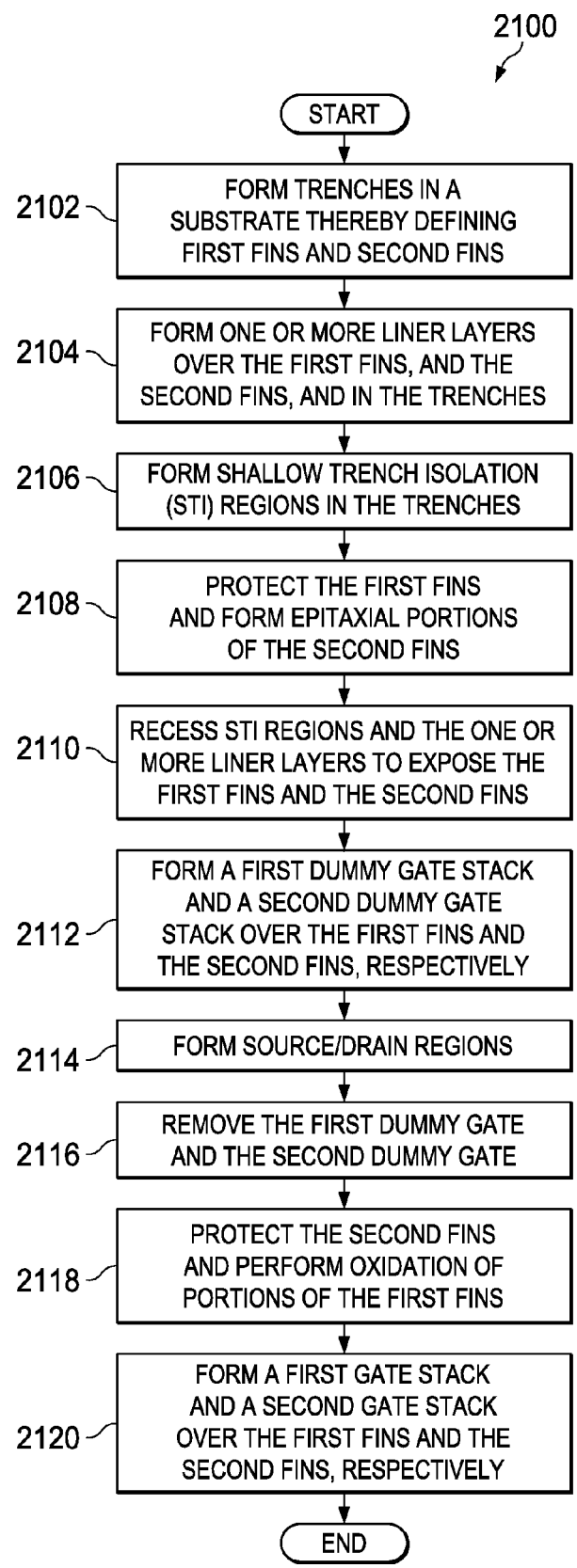
FIG. 21 is a flow diagram illustrating a method of forming a semiconductor device, in accordance with some embodiments.

FIG. 21 is a flowchart illustrating a method 2100 of forming a semiconductor device using a complementary metal-oxide-semiconductor (CMOS) process in accordance with some embodiments. In particular, the semiconductor device described below comprises an NMOS fin field-effect transistor (FinFET) and a PMOS FinFET. FIGS. 22A-31B are three-dimensional views of intermediate stages in the manufacturing of a semiconductor device 2200 in accordance with the method 2100. In particular, "A" figures are three-dimensional views of intermediate stages in the manufacturing of a portion of the semiconductor device 2200 comprising an NMOS FinFET 2200A, and "B" figures are three-dimensional views of intermediate stages in the manufacturing of a portion of the semiconductor device 2200 comprising a PMOS FinFET 2200B. FIGS. 31C and 31D illustrate cross-sectional views (along line AA' in FIG. 31A) of a portion of the semiconductor device 2200 comprising the NMOS FinFET 2200A in accordance with some embodiments. FIGS. 31E-31F illustrate cross-sectional views (along line BB' in FIG. 31B) of a portion of the semiconductor device 2200 comprising the PMOS FinFET 2200B in accordance with some embodiments.

Referring to FIGS. 21-23B, at step 2102, first fins 2302 and second fins 2304 (FIGS. 23A and 23B) are formed in a multilayer substrate 2202. FIGS. 22A and 22B illustrate a first portion of the multilayer substrate 2202 and a second portion of the multilayer substrate 2202, respectively. As described below in greater detail, the NMOS FinFET 2200A is formed on the first portion of the multilayer substrate 2202 and the PMOS FinFET 2200B is formed on the second portion of the multilayer substrate 2202. In some embodiments, the multilayer substrate 2202 is made of a semiconductor material such as silicon, germanium, diamond, or the like. In other embodiments, the multilayer substrate 2202 is made of compound materials such as silicon germanium, silicon carbide, gallium arsenic, indium arsenide, indium phosphide, silicon germanium carbide, gallium arsenic phosphide, gallium indium phosphide, the like, or a combination thereof. In an embodiment, the multilayer substrate 2202 is a silicon-on-insulator (SOI) substrate. Generally, an SOI substrate comprises a layer of a semiconductor material such as epitaxial silicon, germanium, silicon germanium, SOI, silicon germanium on insulator (SGOI), or combinations thereof. In some embodiments, the multilayer substrate 2202 is doped with a p-type dopant, such as boron, aluminum, gallium, or the like, although the substrate may alternatively be doped with an n-type dopant, such as arsenic, phosphorus, or the like.

Figure 22A:
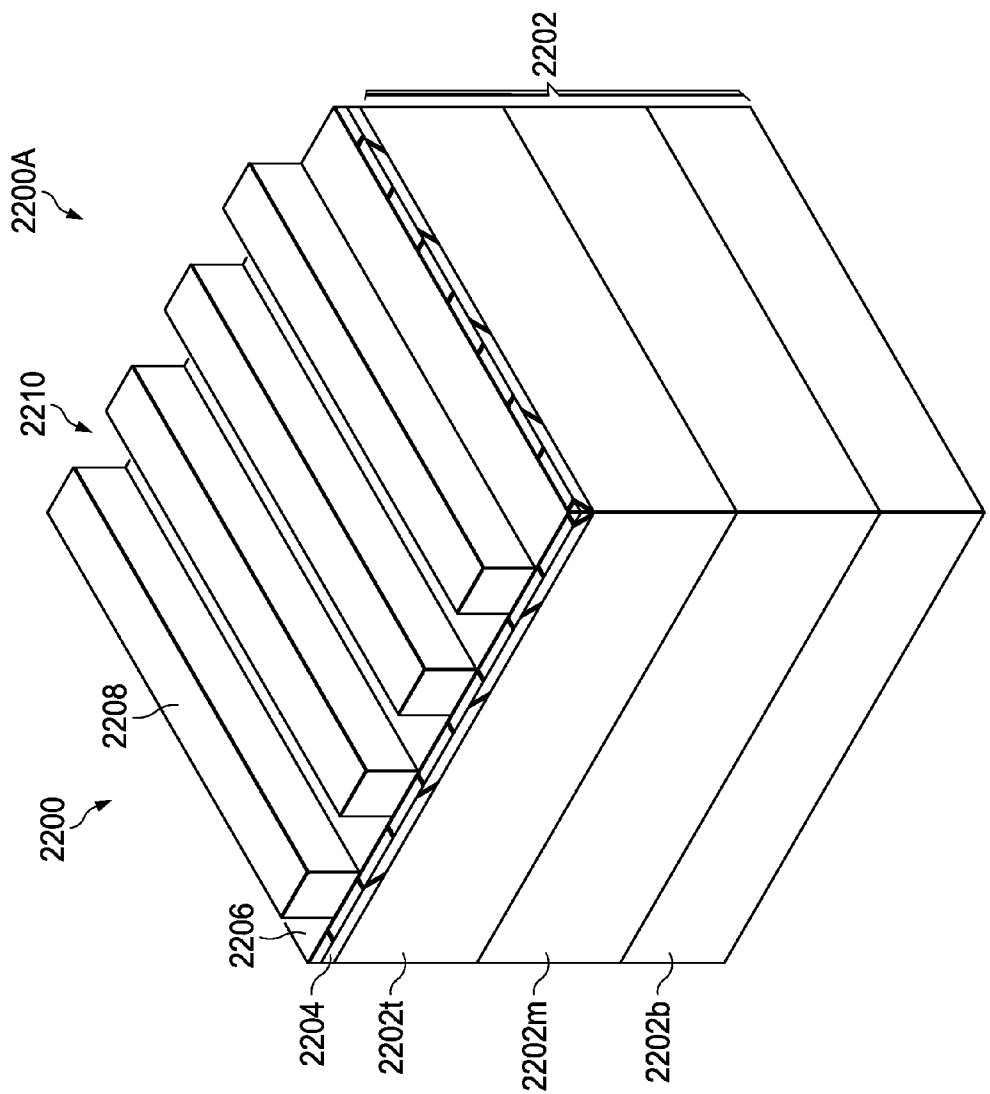
FIGS. 22A-31B are three-dimensional views of intermediate stages in the manufacturing of a semiconductor device, in accordance with some embodiments.

In the illustrated embodiment, the multilayer substrate 2202 comprises a bottom substrate layer 2202b, a middle substrate layer 2202m over the bottom substrate layer 2202b, and a top substrate layer 2202t over the middle substrate layer 2202m as illustrated in FIG. 22A. In some embodiments, the bottom substrate layer 2202b and the top substrate layer 2202t comprise a first semiconductor material having a first lattice constant, and the middle substrate layer 2202m comprises a second semiconductor material having a second lattice constant different from the first lattice constant. For some application, the middle substrate layer 2202m is a strain layer and provides functionality enhancements to the semiconductor device 2200. For example, in some embodiments, the bottom substrate layer 2202b and the top substrate layer 2202t comprise silicon, and the middle substrate layer 2202m comprises silicon germanium.

Figure 22B:
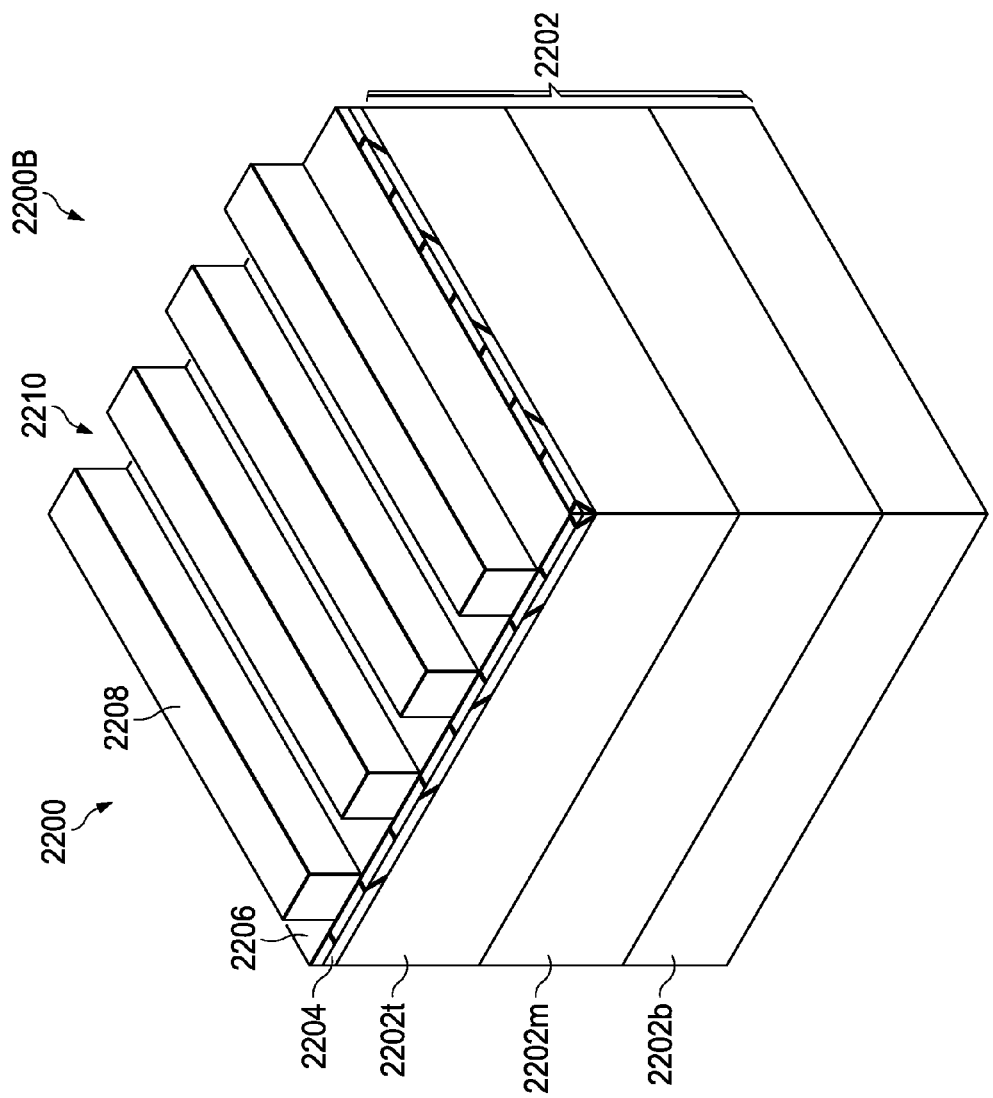

In some embodiments, the multilayer substrate 2202 includes active and/or passive devices (not shown in FIGS. 22A and 22B). As one of ordinary skill in the art will recognize, a wide variety of devices such as transistors, diodes, capacitors, resistors, combinations of these, and the like may be used to generate the structural and functional requirements of the design for the semiconductor device 2200. The devices may be formed using any suitable methods. Only a portion of the multilayer substrate 2202 is illustrated in the figures, as this is sufficient to fully describe the illustrative embodiments.

In some embodiments, the first fins 2302 and the second fins 2304 are formed by patterning the multilayer substrate 2202. For example, FIGS. 22A and 22B illustrate a pad layer 2204 and a mask layer 2206 formed on a top surface of the multilayer substrate 2202. The pad layer 2204 may be a thin film comprising silicon oxide formed, for example, using a thermal oxidation process. The pad layer 2204 may act as an adhesion layer between the multilayer substrate 2202 and mask layer 2206. The pad layer 2204 may also act as an etch stop layer for etching the mask layer 2206. In some embodiments, the mask layer 2206 is formed of silicon nitride, for example, using low-pressure chemical vapor deposition (LPCVD) or plasma enhanced chemical vapor deposition (PECVD). The mask layer 2206 is used as a hard mask during subsequent photolithography processes. A photo-sensitive layer 2208 is formed on the mask layer 2206 and is then patterned, forming openings 2210 in the photo-sensitive layer 2208.

Figure 23A:
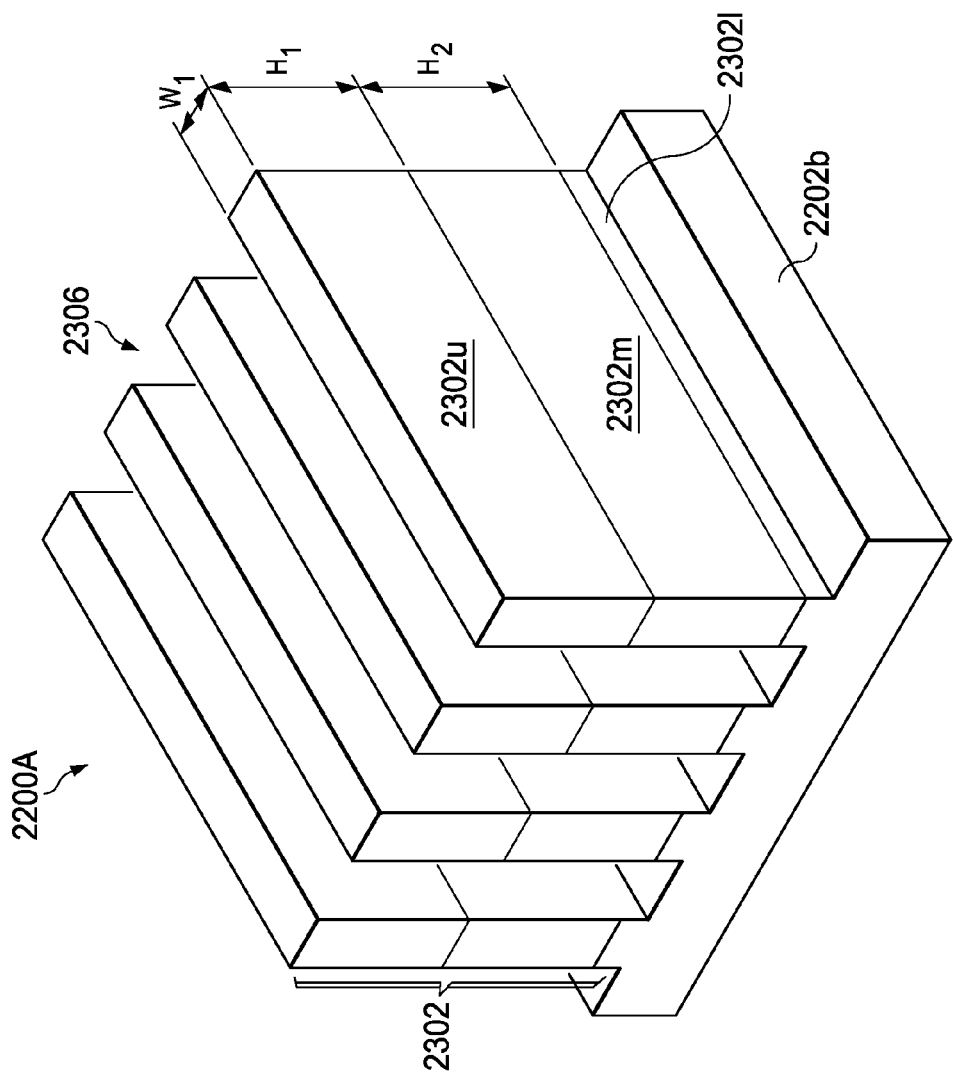
Figure 23B:
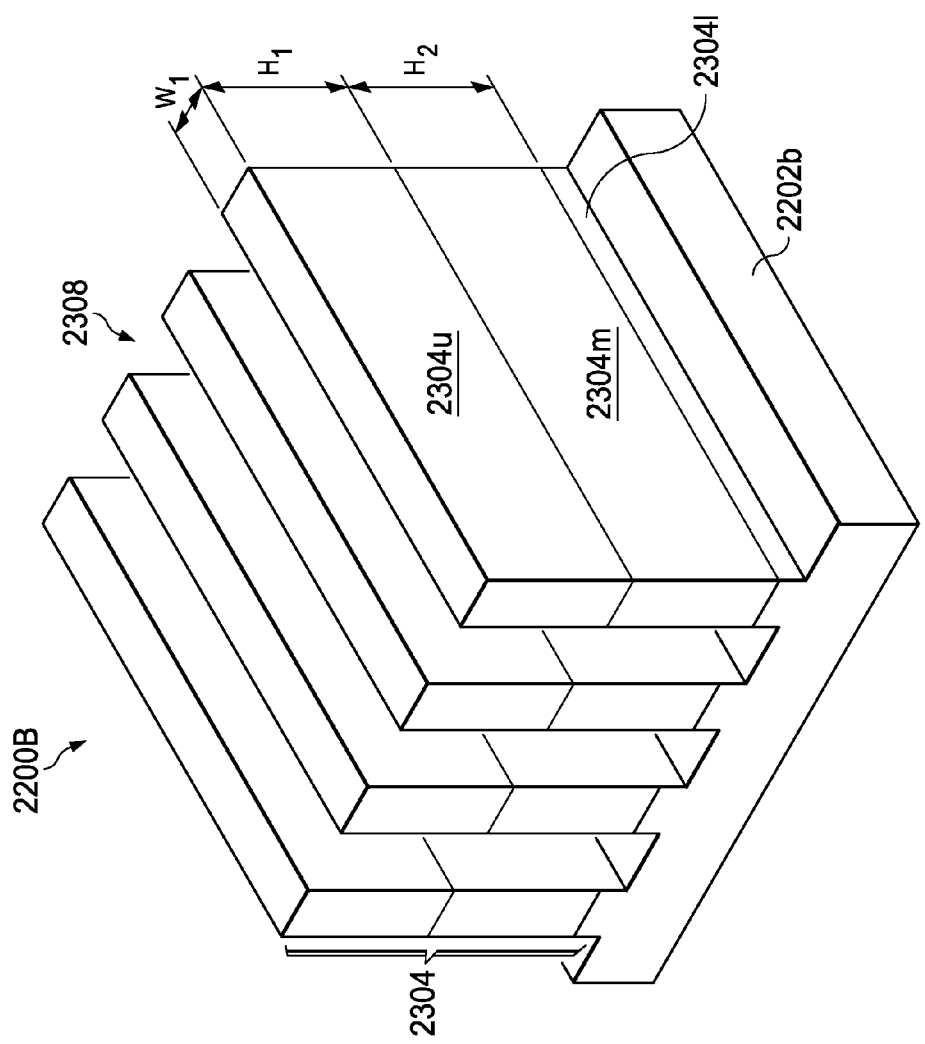

In some embodiments, the mask layer 2206 and pad layer 2204 are etched through openings 2210 to expose the underlying multilayer substrate 2202. The exposed multilayer substrate 2202 is then etched to form first trenches 2306 and second trenches 2308 as illustrated in FIGS. 23A and 23B, respectively. Portions of the multilayer substrate 2202 between the first trenches 2306 form the first fins 2302. Portions of the multilayer substrate 2202 between the second trenches 2308 form the second fins 2304. In some embodiments, the first trenches 2306 and the second trenches 2308 may be strips (viewed from in the top of the semiconductor device 2200) parallel to each other, and closely spaced with respect to each other. In other embodiments, the first trenches 2306 and the second trenches 2308 may be continuous and surrounding the first fins 2302 and the second fins 2304, respectively.

During the patterning process the photo-sensitive layer 2208 may be fully consumed. If any residue of the photo-sensitive layer 2208 remains over the multilayer substrate 2202, the residue is also removed. In some embodiments, the mask layer 2206 formed of silicon nitride may be removed using a wet process using hot $H_3PO_4$, while pad layer 2204 may be removed using diluted HF acid, if formed of silicon oxide. In other embodiments, the mask layer 2206 and pad layer 2204 may be removed at later manufacturing stages, for example, during subsequently performed planarization process.

Figure 25A:
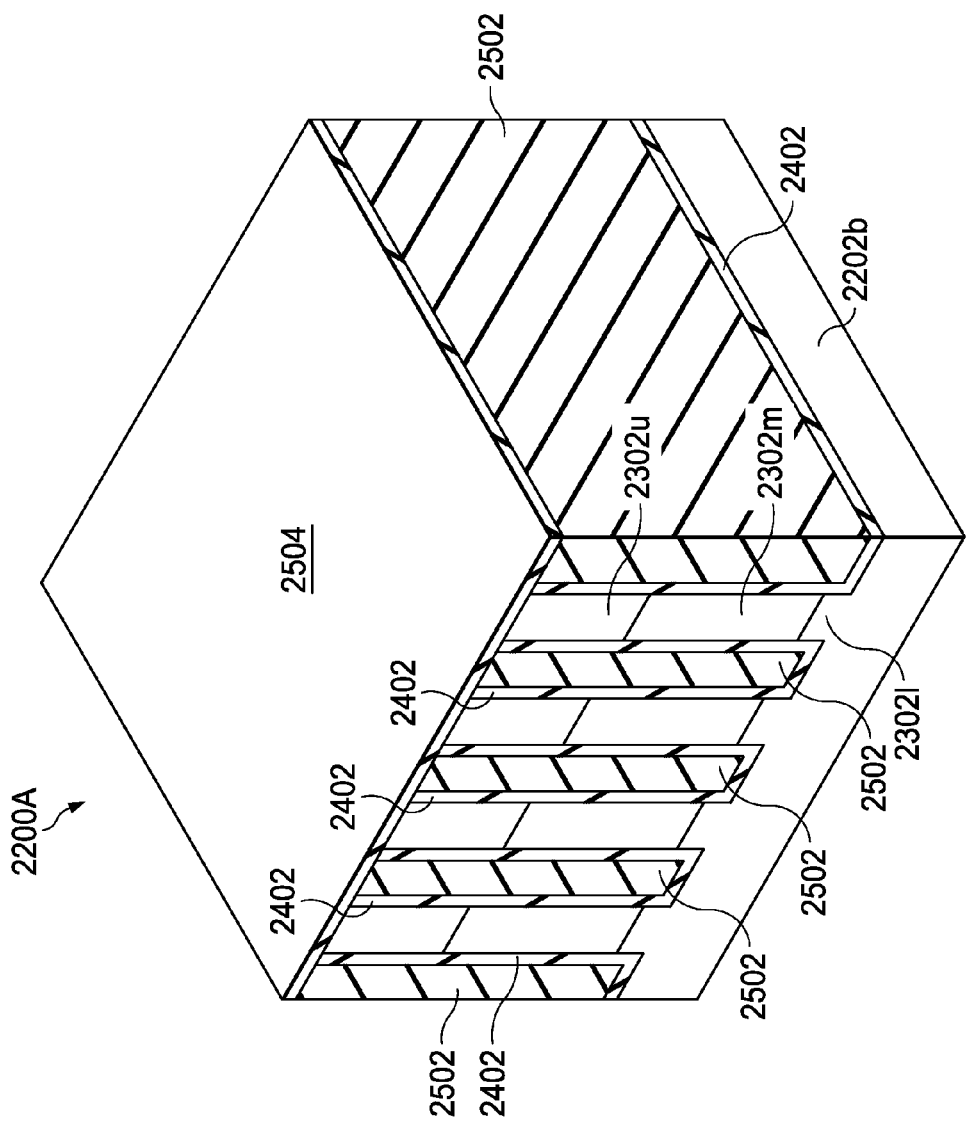
Figure 25B:
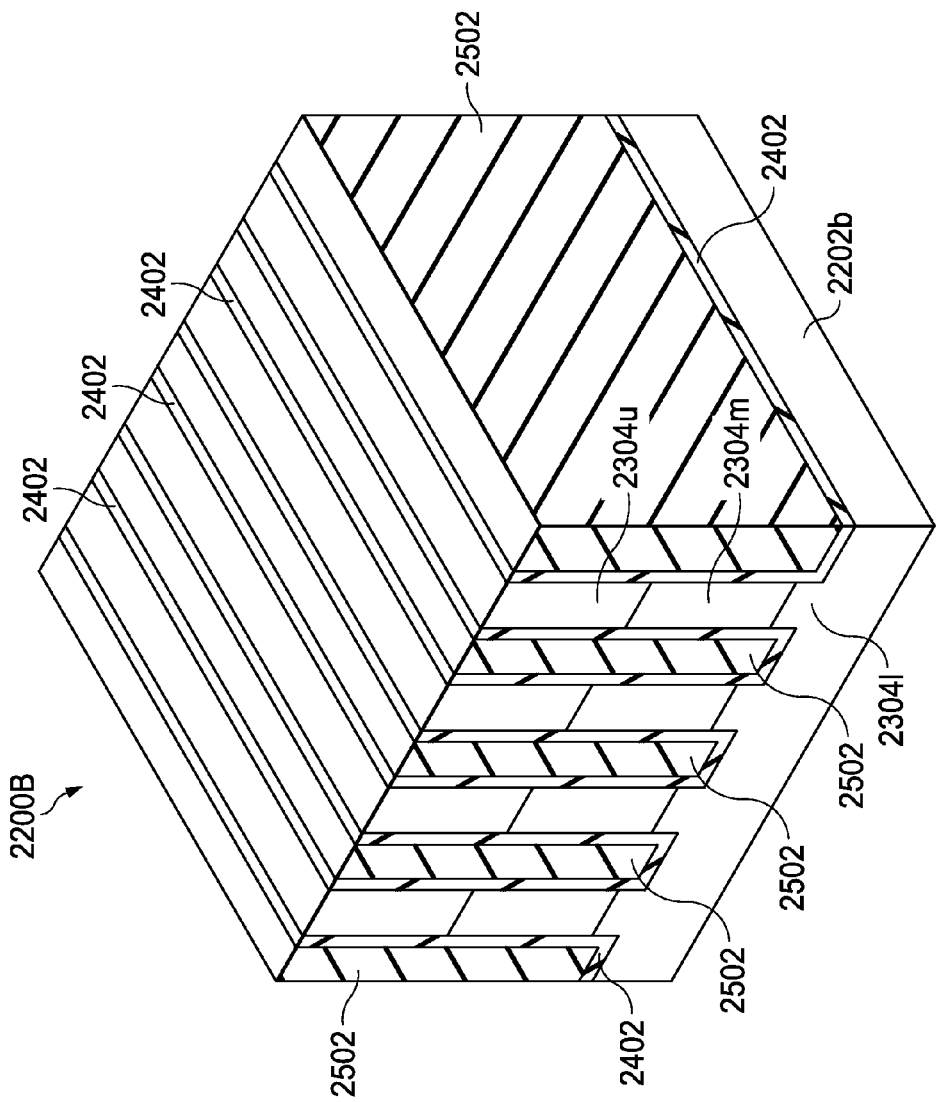

In other embodiments, the first fins 2302 and the second fins 2304 may be epitaxially grown from a top surface of the bottom substrate layer 2202$b$ within trenches or openings formed in a patterned layer (e.g. shallow trench isolation (STI) regions 2502 illustrated in FIGS. 25A and 25B) atop the bottom substrate layer 2202$b$.

The first fins 2302 and the second fins 2304 may be formed of a semiconductor material such as silicon, germanium, silicon germanium, or the like. The first fins 2302 and the second fins 2304 may then doped through, for example, an implantation process to introduce p-type or n-type impurities into the first fins 2302 and the second fins 2304. As illustrated in FIG. 23A, the first fins 2302 comprise first lower fins 2302$l$, first upper fins 2302$u$, and first middle fins 2302$m$ interposed between the first lower fins 2302$l$ and the first upper fins 2302$u$. As illustrated in FIG. 23B, the second fins 2304 comprise second lower fins 2304$l$, second upper fins 2304$u$, and second middle fins 2304$m$ interposed between the second lower fins 2304$l$ and the second upper fins 2304$u$. In some embodiments, the first lower fins 2302$l$, the second lower fins 2304$l$, the first upper fins 2302$u$, and the second upper fins 2304$u$ comprise silicon, while the first middle fins 2302$m$ and the second middle fins 2304$m$ comprise silicon germanium. In the illustrated embodiment, the first middle fins 2302$m$ the second middle fins 2304$m$ are formed of silicon germanium (SiGe) with a germanium concentration between about 20% and about 45%. In some embodiments, the first fins 2302 and the second fins 2304 have a first width $W_1$ between about 4 nm and 10 nm, the first upper fins 2302$u$ and the second upper fins 2304$u$ have a first height $H_1$ between 20 nm and about 40 nm, and the first middle fins 2302$m$ and the second middle fins 2304$m$ have a second height $H_2$ between 4 nm and about 10 nm.

Figure 24A:
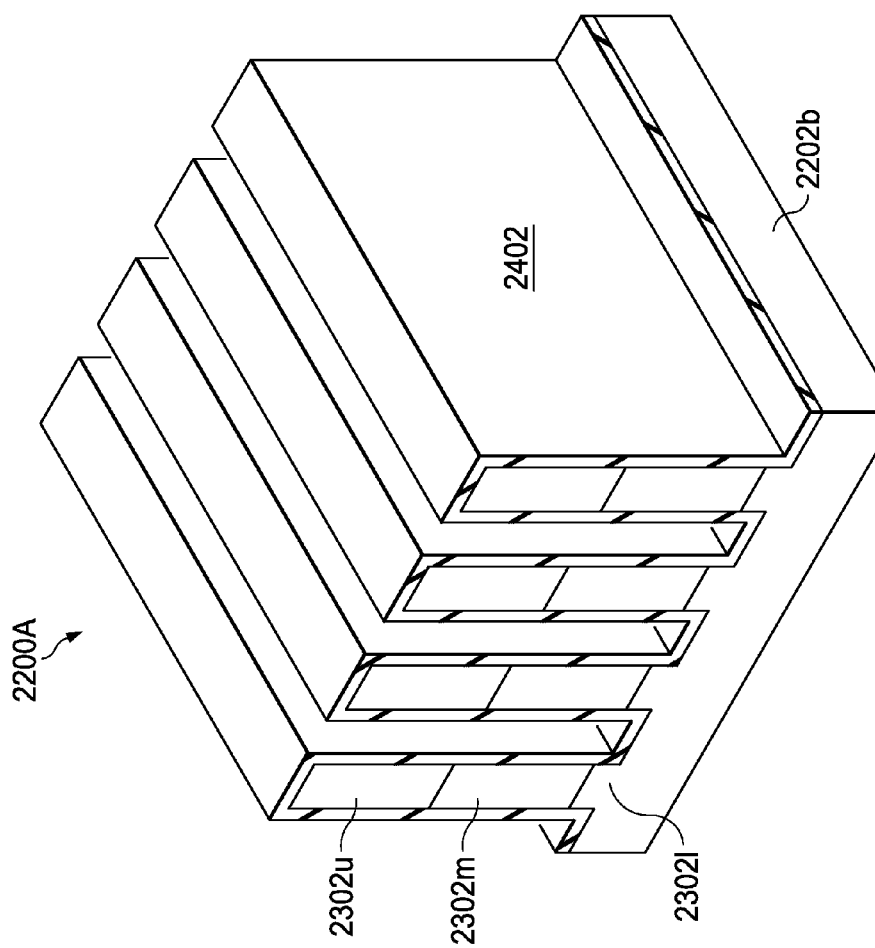
Figure 24B:
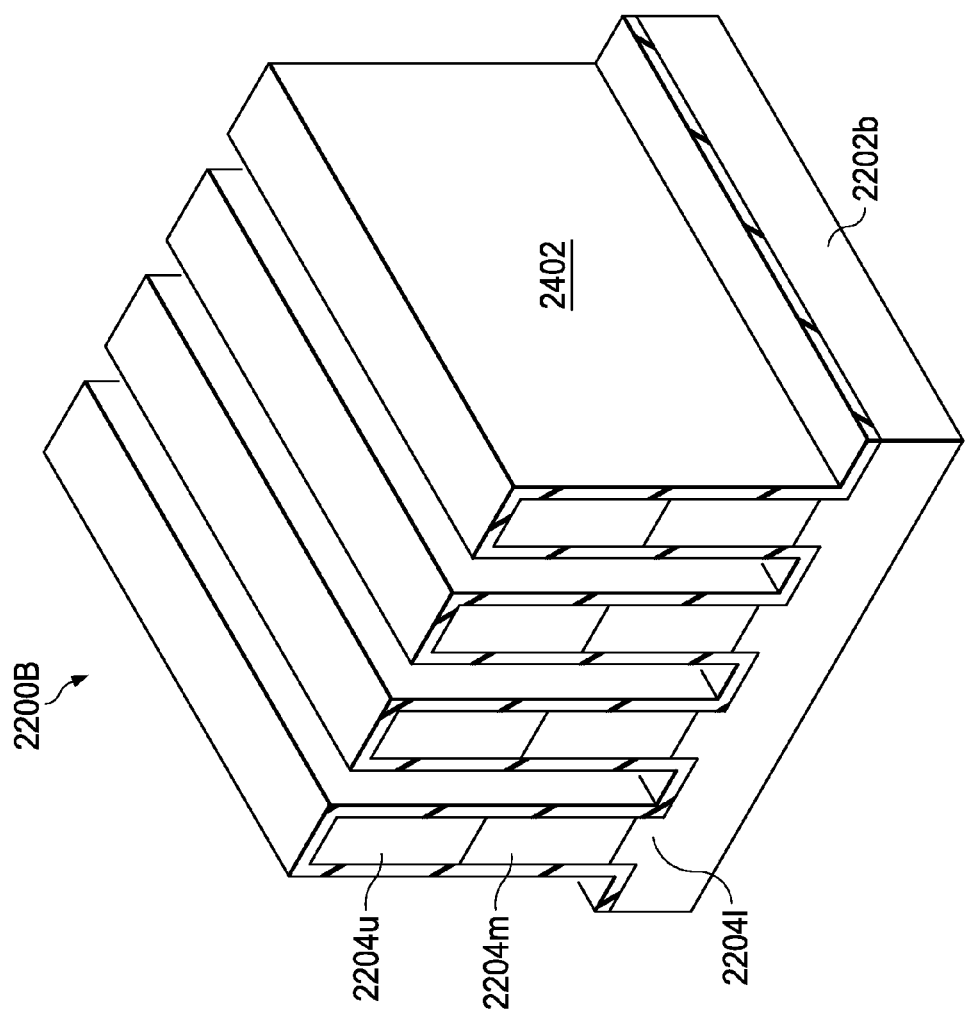

Referring to FIGS. 24A and 24B, at step 2104 of the method 2100 (see FIG. 21), a liner layer 2402 is formed over top surfaces and sidewalls of the first fins 2302, sidewalls the second fins 2304 and over bottoms of the first trenches 2306 and the second trenches 2308. The liner layer 2402 comprises one or more layers of silicon, silicon nitride, silicon oxynitride, $Al_2O_3$, or the like. In some embodiments, the liner layer 2402 is deposited through one or more processes such as physical vapor deposition (PVD), chemical vapor deposition (CVD), or atomic layer deposition (ALD), although any acceptable process may be utilized.

In some embodiments, the liner layer 2402 has a single layer structure with a thickness between about 20 Å and about 60 Å as illustrated in FIGS. 24A and 24B (see also FIGS. 31C and 31D). In other embodiments, the liner layer 2402 has a bilayer structure comprising a first liner sub-layer 2402$_1$ and a second liner sub-layer 2402$_2$ (see FIGS. 31E and 31F). In some embodiments, the first liner sub-layer 2402$_1$ comprises silicon, or silicon oxynitride and has a thickness between about 10 Å and about 30 Å, and the second liner sub-layer 2402$_2$ comprises silicon nitride or $Al_2O_3$ and has a thickness between about 20 Å and about 60 Å.

Referring to FIGS. 25A and 25B, at step 2106 of the method 2100 (see FIG. 21), the STI regions 2502 are formed between the neighboring first fins 2302 and between the neighboring second fins 2304. In some embodiments, one or more suitable dielectric materials are blanket deposited on the multilayer substrate 2202 and over the first fins 2302 and the second fins 2304. The STI regions 2502 are made of suitable dielectric materials such as silicon oxide, silicon nitride, silicon oxynitride, fluoride-doped silicate glass (FSG), low-k dielectrics such as carbon doped oxides, extremely low-k dielectrics such as porous carbon doped silicon dioxide, a polymer such as polyimide, combinations of these, or the like. In some embodiments, the STI regions 2502 are formed through a process such as chemical vapor deposition (CVD), flowable CVD (FCVD), or a spin-on-glass process, although any acceptable process may be utilized. Subsequently, portions of the STI regions 2502 extending over the top surfaces of the first fins 2302 and the second fins 2304, and portions of the liner layer 2402 over the top surfaces of the first fins 2302 and the second fins 2304 are removed using, for example, an etch process, chemical mechanical polishing (CMP), or the like.

In some embodiments, the STI formation process described above may include a curing process. The curing process may cause undesired oxidation of the first fins 2302 and the second fins 2304. In the illustrated embodiment, the liner layer 2402 protects the first fins 2302 and the second fins 2304 from undesired oxidation, by preventing diffusion of oxygen (O) from the STI regions 2502 to the first fins 2302 and the second fins 2304.

Referring further to FIGS. 25A and 25B, at step 2108 of the method 2100 (see FIG. 21), a first hard mask 2504 is formed over the first portion of the multilayer substrate 2202. The first hard mask 2504 may be formed by depositing a dielectric material over the semiconductor device 2200, for example, using low-pressure chemical vapor deposition (LPCVD), plasma enhanced chemical vapor deposition (PECVD), or the like. Subsequently, the dielectric material is patterned to expose the second portion of the multilayer substrate 2202 for further processing. The remaining dielectric material forms the first hard mask 2504 over first portion of the multilayer substrate 2202 to protect the first portion of the multilayer substrate 2202 from further processes performed on the second portion of the multilayer substrate 2202. In some embodiments, the first hard mask 2504 may comprise one or more layer of silicon oxide, silicon nitride, silicon oxynitride, or the like.

Figure 26A:
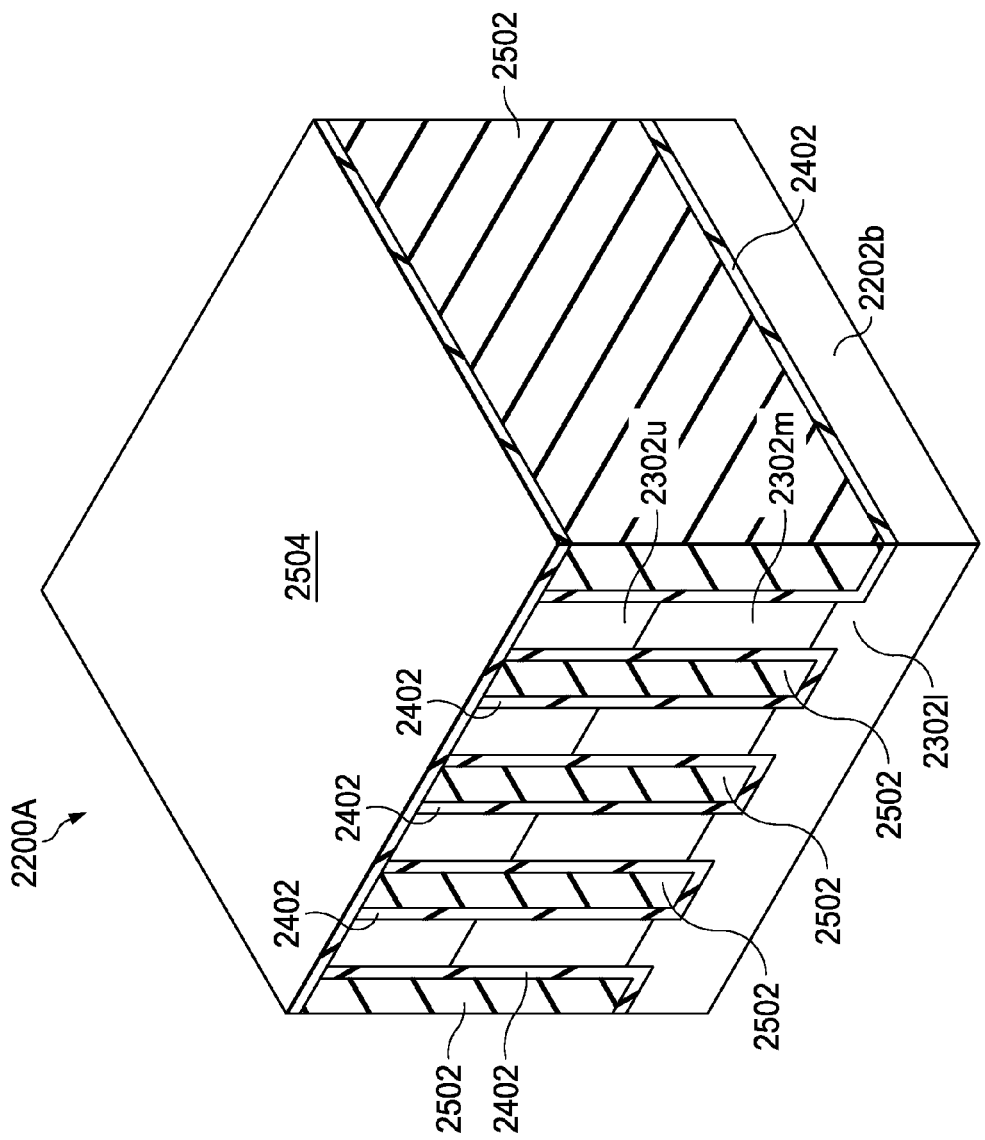
Figure 26B:
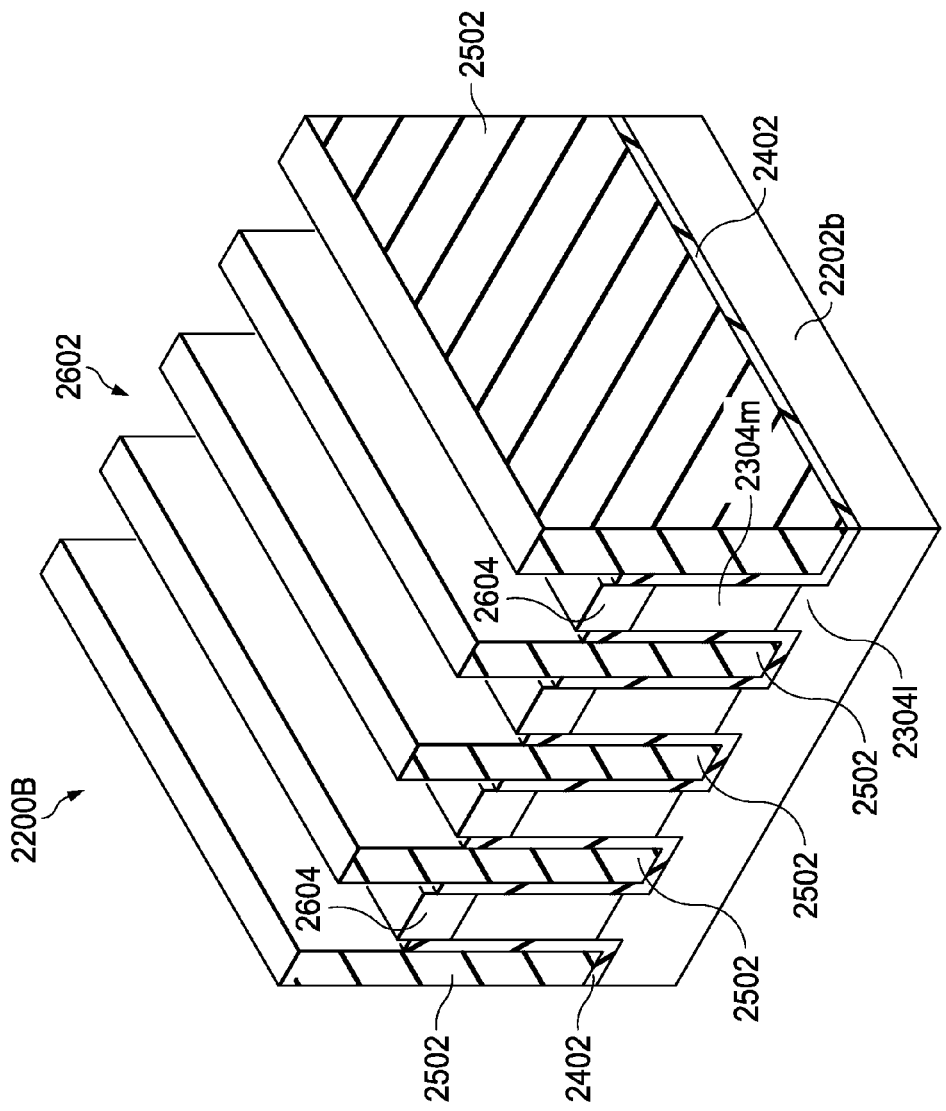

Referring to FIG. 26B, during step 2108 (see FIG. 21), upper portions of the second upper fins 2304$u$ are removed. As described below in greater detail, the second upper fins 2304$u$ are replaced by other semiconductor material to enhance device performance. In some embodiments, using the STI regions 2502 as an etch mask, an anisotropic plasma etching process is performed to recess the second upper fins 2304$u$ and the liner layer 2402 to form the second openings 2602 between the neighboring STI regions 2502. The remaining portions of the second upper fins 2304$u$ between the neighboring STI regions 2502 are hereinafter referred to as lower portions 2604 of the second upper fins 2304$u$. In some embodiments, the lower portions 2604 may include the first semiconductor material having the first lattice constant. In the illustrated embodiment, the first semiconductor material comprises Si or III-V semiconductor material. In some embodiments with the second upper fins 2304$u$ comprising silicon, the anisotropic etching process may be performed using a chemical selected from $Cl_2$, HBr, $NF_3$, $CF_4$, and $SF_6$ as an etching gas.

During the etch process described above with reference to FIG. 26B, the first portion of the multilayer substrate 2202 is protected by the hard mask 2504 as illustrated in FIG. 26A. In some embodiments, the first hard mask 2504 protects the first portion of the multilayer substrate 2202 from chemicals used in the etch process.

Figure 27A:
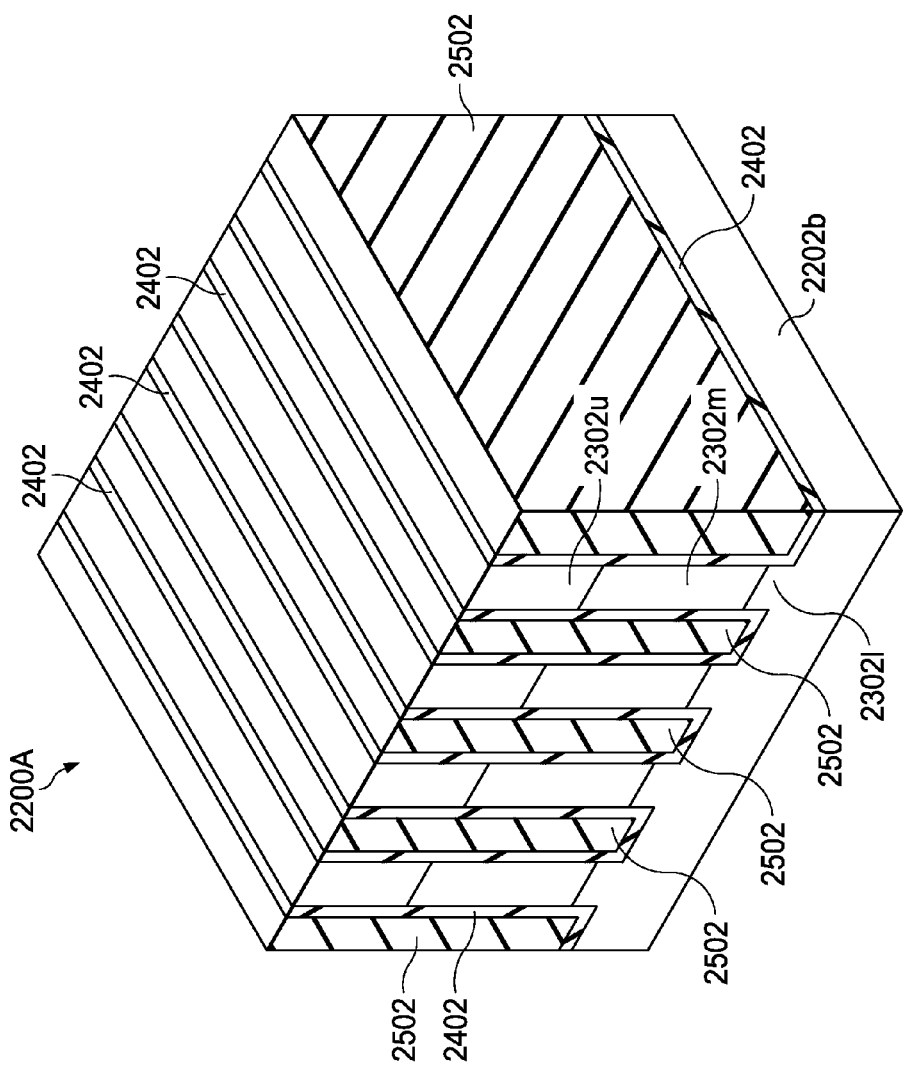
Figure 27B:
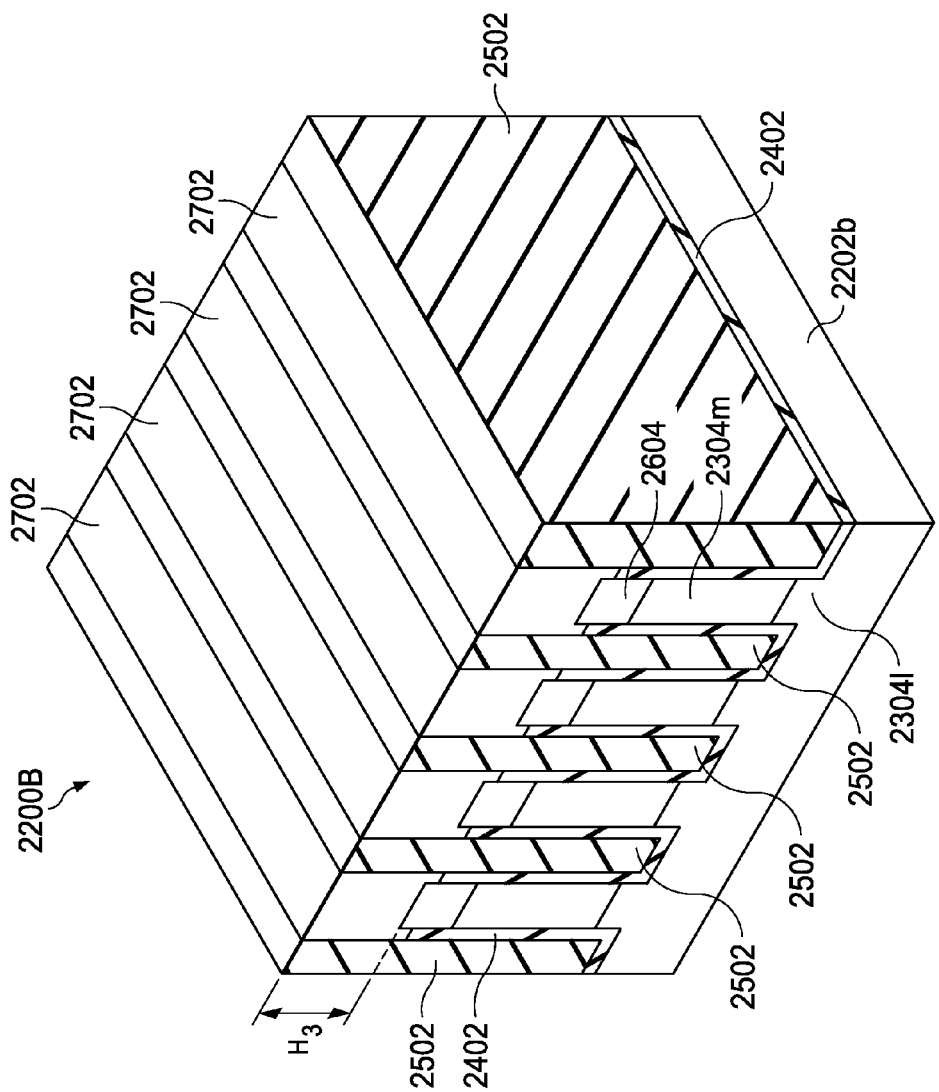

Referring to FIG. 27B, during step 2108 (see FIG. 21), a second semiconductor material is grown in the second openings 2602 to form upper portions 2702 of the second upper fins 2304u, wherein the second semiconductor material has a second lattice constant different from the first lattice constant of the first semiconductor material. In some embodiments, the second semiconductor material comprises germanium (Ge) or silicon germanium (SiGe). The second semiconductor material may overfill the second openings 2602 and may be planarized to be substantially coplanar with top surfaces of the STI regions 2502. In an embodiment, the second semiconductor material is planarized by using a CMP to remove portions of the second semiconductor material. In other embodiments, other planarization techniques may be used, such as etching. In some embodiments, the upper portions 2702 of the second upper fins 2304u have a third height $H_3$ between 20 nm and about 40 nm. In the illustrated embodiment, the upper portions 2702 of the second upper fins 2304u are formed of SiGe with a Ge concentration between about 45% and about 100%.

In some embodiments, the upper portions 2702 of the second upper fins 2304u may comprise SiGe. The second semiconductor material such as SiGe is selectively grown by an LPCVD process to partially fill the second openings 2602. In an embodiment, the LPCVD process is performed at a temperature of about 400 to about 800° C. and under a pressure of about 1 to about 200 Torr, using $SiH_2Cl_2$, $SiH_4$, $GeH_4$, HCl, $B_2H_6$, and $H_2$ as reaction gases.

In some embodiments, the upper portions 2702 of the second upper fins 2304u may comprise Ge. The second semiconductor material such as Ge is selectively grown by an LPCVD process to partially fill the second openings 2602. In an embodiment, the LPCVD process is performed at a temperature of about 350° C. to 450° C. and under a pressure of about 10 mTorr to 100 mTorr, using $GeH_4$, $GeH_3CH_3$, and/or $(GeH_3)_2CH_2$ as epitaxial gases. Optionally, an anneal process after the growing process is performed at a temperature of about 550° C. to 750° C.

Referring to FIG. 27A, in some embodiments, the first hard mask 2504 is removed from the first portion of the multilayer substrate 2202 using the same planarization process as described above with reference to FIG. 27B. In other embodiments, the first hard mask 2504 formed of silicon nitride is removed using hot $H_3PO_4$.

Figure 28A:
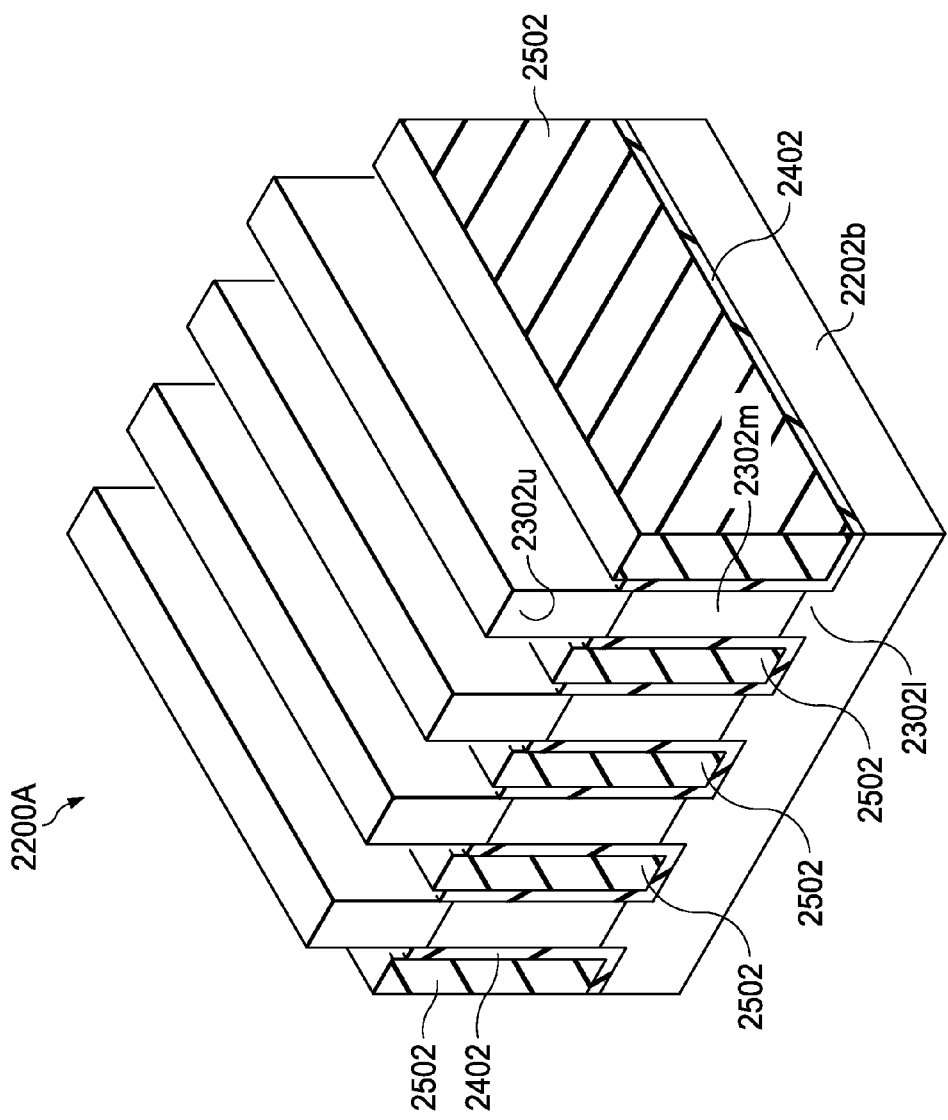
Figure 28B:
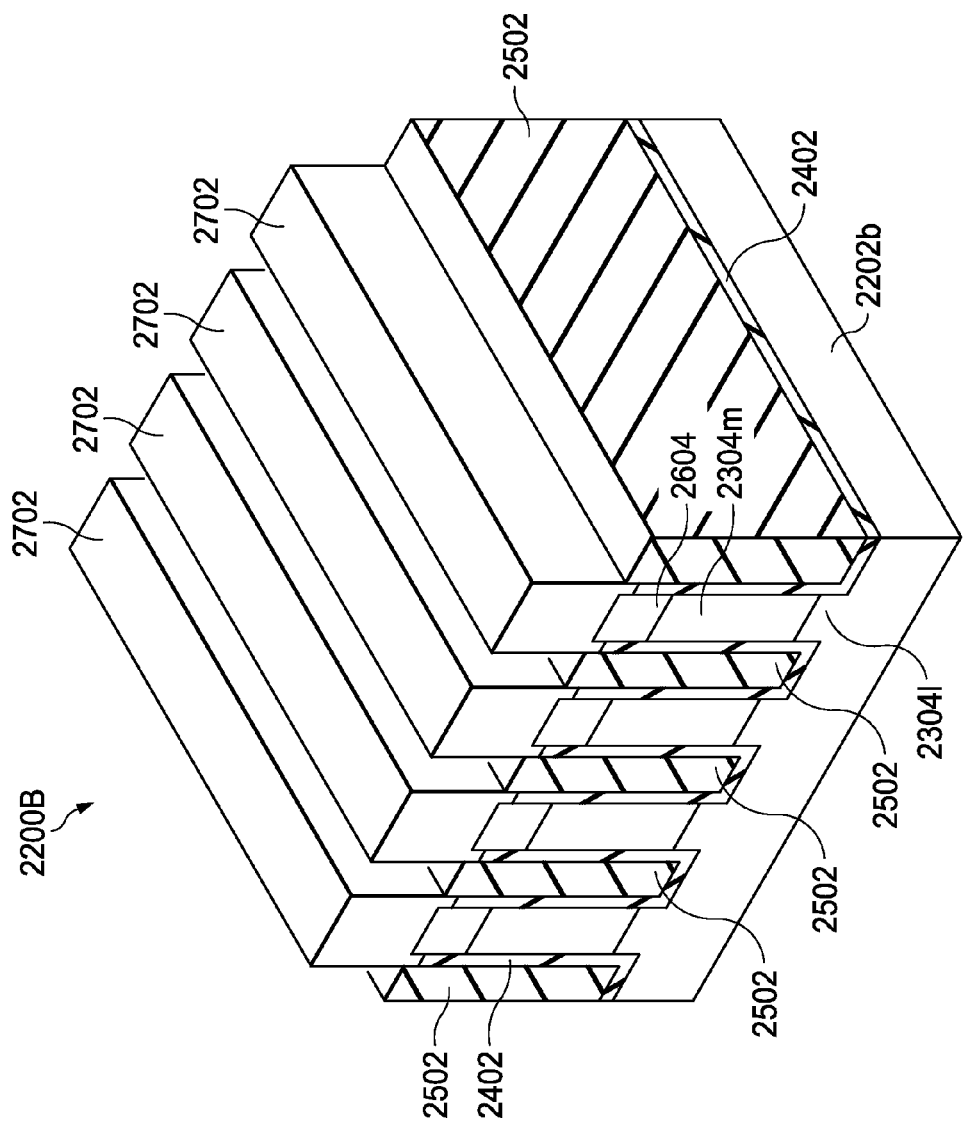

Referring to FIGS. 28A and 28B, at step 2110 of the method 2100 (see FIG. 21), the STI regions 2502 and the liner layer 2402 are recessed to expose sidewalls of the first upper fins 2302u and the upper portions 2702 of the second upper fins 2304u. In some embodiments, the STI regions 2502 and the liner layer 2402 are recessed using one or more etch processes utilizing the first fins 2302 and the second fins 2304 as an etch mask. For example, the STI regions 2502 and the liner layer 2402 are recessed using a single etch processes. In alternative embodiments, the STI regions 2502 and the liner layer 2402 are recessed using a double etch processes. For example, the STI regions 2502 is recessed using a first etch process utilizing the first fins 2302, the second fins 2304, and the liner layer 2402 as an etch mask, and, subsequently, the liner layer 2402 is recess using a second etch process. In the illustrated embodiment, after the recess process top surfaces of the STI regions 2502 and the liner layer 2402 are higher than the top surfaces of the first middle fins 2302m and the second middle fins 2304m.

Figure 29A:
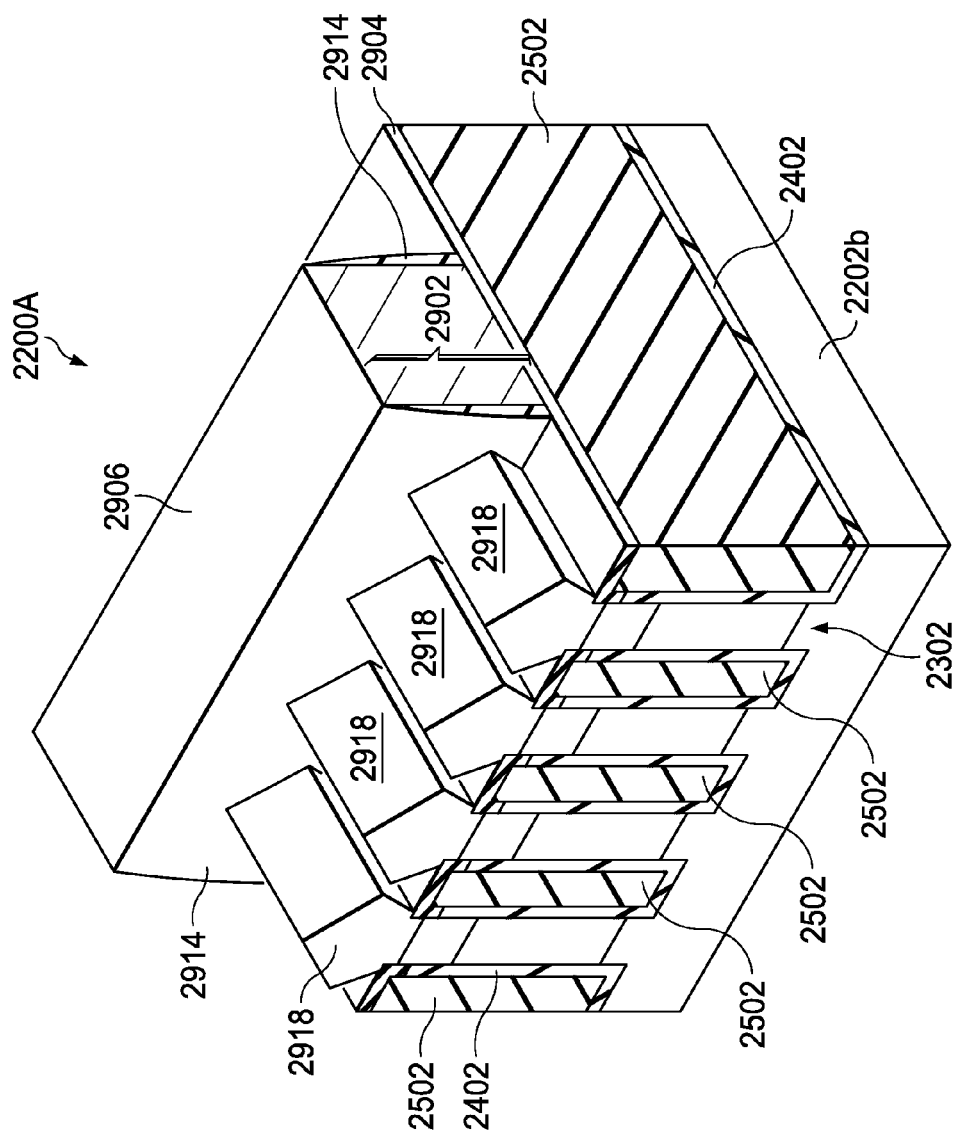
Figure 29B:
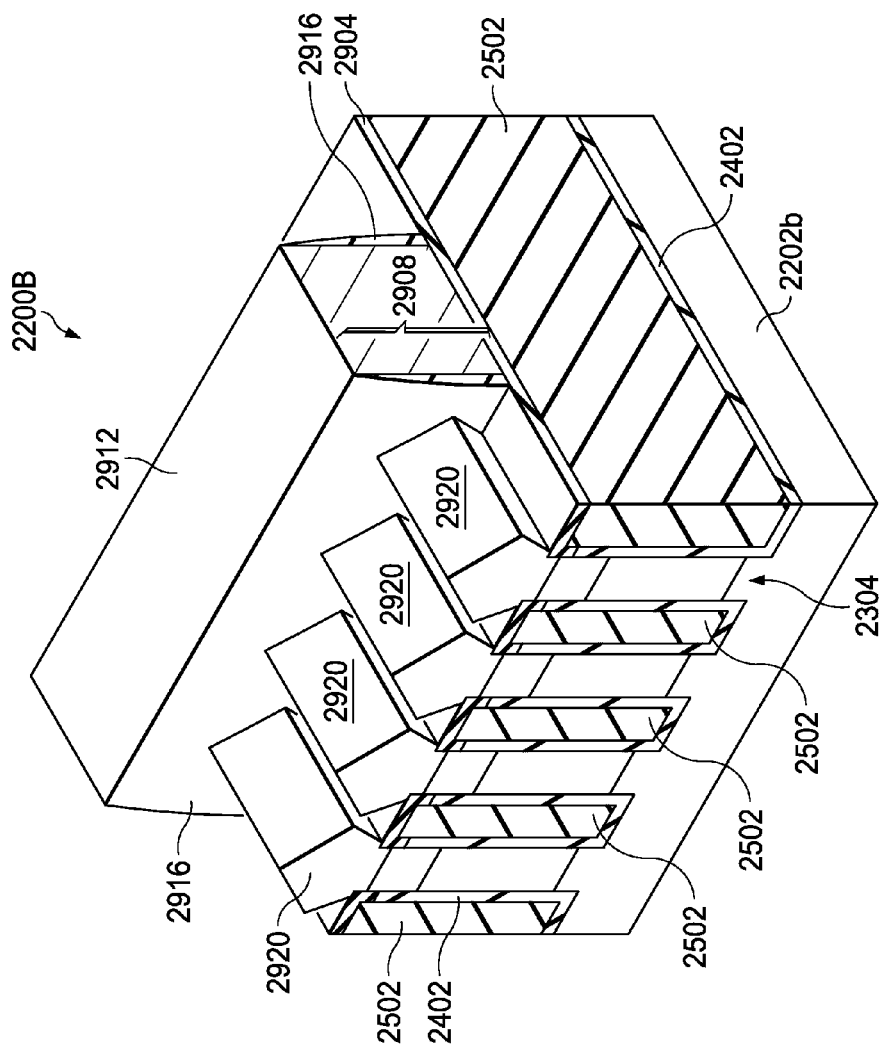

Referring to the FIGS. 29A and 29B, at step 2112 of the method 2100 (see FIG. 21), a first dummy gate stack 2902 and a second dummy gate stack 2908 are formed over the first fins 2302 and the second fins 2304, respectively. In some embodiments, a dummy gate dielectric layer 2904 is formed over the exposed first fins 2302 and the second fins 2304. The dummy gate dielectric layer 2904 may be formed by thermal oxidation, CVD, sputtering, or any other methods known and used in the art for forming a dummy gate dielectric layer. In some embodiments, the dummy gate dielectric layer 2904 may be formed of a same material as the STI regions 2502. In other embodiments, the dummy gate dielectric layer 2904 may be made of one or more suitable dielectric materials such as silicon oxide, silicon nitride, low-k dielectrics such as carbon doped oxides, extremely low-k dielectrics such as porous carbon doped silicon dioxide, a polymer such as polyimide, the like, or a combination thereof. In other embodiments, the dummy gate dielectric layer 2904 includes dielectric materials having a high dielectric constant (k value), for example, greater than 3.9. The materials may include silicon nitrides, oxynitrides, metal oxides such as $HfO_2$, HfZrOx, $HfSiO_x$, $HfTiO_x$, $HfAlO_x$, the like, or combinations and multi-layers thereof.

Subsequently, a dummy gate electrode layer (not shown) is formed over the dummy gate dielectric layer 2904. In an embodiment, the dummy gate electrode layer is a conductive material and may be selected from a group comprising poly-crystalline-silicon (poly-Si), poly-crystalline silicon-germanium (poly-SiGe), metallic nitrides, metallic silicides, metallic oxides, and metals. In an embodiment, the dummy gate electrode layer may be deposited by physical vapor deposition (PVD), CVD, sputter deposition, or other techniques known and used in the art for depositing conductive materials. The top surface of the dummy gate electrode layer usually has a non-planar top surface and may be planarized after it is deposited. The dummy gate electrode layer and the dummy gate dielectric layer may be patterned to form a first dummy gate electrode 2906 and a second dummy gate electrode 2912. The gate patterning process may be accomplished by depositing a mask material (not shown) such as photoresist, silicon oxide, silicon nitride, or the like over the dummy gate electrode layer. The mask material is then patterned and the dummy gate electrode layer is etched in accordance with a desired pattern.

Referring further to FIGS. 29A and 29B, in some embodiments, first gate spacers 2914 are formed on sidewalls of the first dummy gate stack 2902, and second gate spacers 2916 are formed on sidewalls of the second dummy gate stack 2908. The first gate spacers 2914 and the second gate spacers 2916 may include one or more layers of a dielectric material such as silicon oxide, silicon nitride, silicon carbide, silicon oxynitride, or combinations thereof. The first gate spacers 2914 and the second gate spacers 2916 may be formed by, for example, depositing a dielectric material over the gate and anisotropically etching the dielectric material.

In some embodiments, portions of the first fins 2302 and the second fins 2304 not masked by the first dummy gate stack 2902 and the second dummy gate stack 2908 are doped to form lightly doped regions (not shown). In this embodiment, the portions of the first fins 2302 and the second fins 2304 not masked by the first dummy gate stack 2902 and the second dummy gate stack 2908 are lightly doped before the first gate spacers 2914 and the second gate spacers 2916 are formed.

Referring further to FIGS. 29A and 29B, at step 2114 of the method 2100 (see FIG. 21), after forming the first dummy gate stack 2902 and the second dummy gate stack 2908, portions of the first upper fins 2302u and the second upper fins 2304u are removed and recesses (not shown) are formed in the first upper fins 2302u and the second upper fins 2304u. The recesses are formed, for example, using an etch process and utilizing the first dummy gate electrode 2906, the second dummy gate electrode 2912, and the STI regions 2502 as an etch mask. The etch process may selectively etch the first upper fins 2302u and the second upper fins 2304u without etching the STI regions 2502, the first dummy gate electrode 2906 and the second dummy gate electrode 2912. The etch process may be performed in a variety of ways. In an embodiment, the etch process may be performed by a dry chemical etch with a plasma source and an etchant gas. The plasma source may be an inductively coupled plasma (ICR) etch, a transformer coupled plasma (TCP) etch, an electron cyclotron resonance (ECR) etch, a reactive ion etch (RIE), or the like and the etchant gas may be fluorine, chlorine, bromine, combinations thereof, or the like. In another embodiment, the etch process may be performed by a wet chemical etch, such as ammonium peroxide mixture (APM), $NH_4OH$, TMAH, combinations thereof, or the like. In yet another embodiment, the etch process may be performed by a combination of a dry chemical etch and a wet chemical etch.

After the recesses are formed, the first source/drain regions 2918 and the second source/drain regions 2920 are formed in the recesses as illustrated in FIGS. 29A and 29B, respectively. In some embodiments, the first source/drain regions 2918 and the second source/drain regions 2920 are formed by epitaxially growing SiGe, Ge, Si, combinations thereof, or the like in the recesses. The growth of the first source/drain regions 2918 and the second source/drain regions 2920 may be substantially confined by the STI regions 2502. In some embodiments, top surfaces of the first source/drain regions 2918 and the second source/drain regions 2920 may be have facets which are non-parallel and non-perpendicular to the top surfaces of the first upper fins 2302u and the second upper fins 2304u, respectively. The first source/drain regions 2918 and the second source/drain regions 2920 may be doped either through an implanting process to implant appropriate dopants, or else by in-situ doping as the material is grown.

In some embodiment, the first upper fins 2302u have a first lattice constant and the first source/drain regions 2918 have a second lattice constant, the second lattice constant being different from the first lattice constant. In addition, the second upper fins 2304u have a third lattice constant and the second source/drain regions 2920 have a fourth lattice constant, the third lattice constant being different from the fourth lattice constant. In the illustrated embodiment, the first source/drain regions 2918 are formed of Si doped by phosphorus (P) to form an NMOS FinFET device, and the second source/drain regions 2920 are formed of SiGe doped by boron (B) to form a PMOS FinFET device.

Although FIGS. 29A and 29B only illustrates the first source/drain regions 2918 and the second source/drain regions 2920 on one side of the first dummy gate stack 2902 and the second dummy gate stack 2908, respectively, the first source/drain regions 2918 and the second source/drain regions 2920 on the opposite sides of the dummy gate stacks have a similar structural configuration.

Figure 30A:
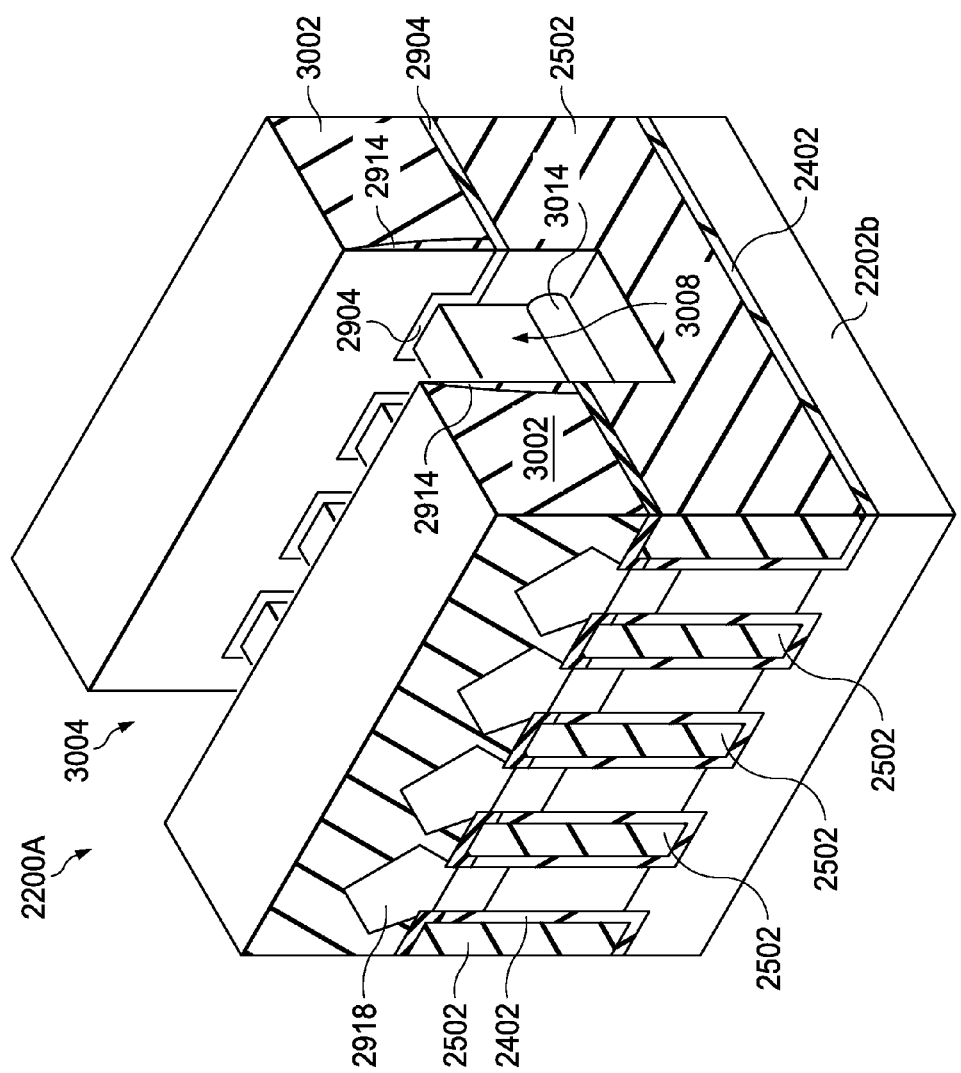
Figure 30B:
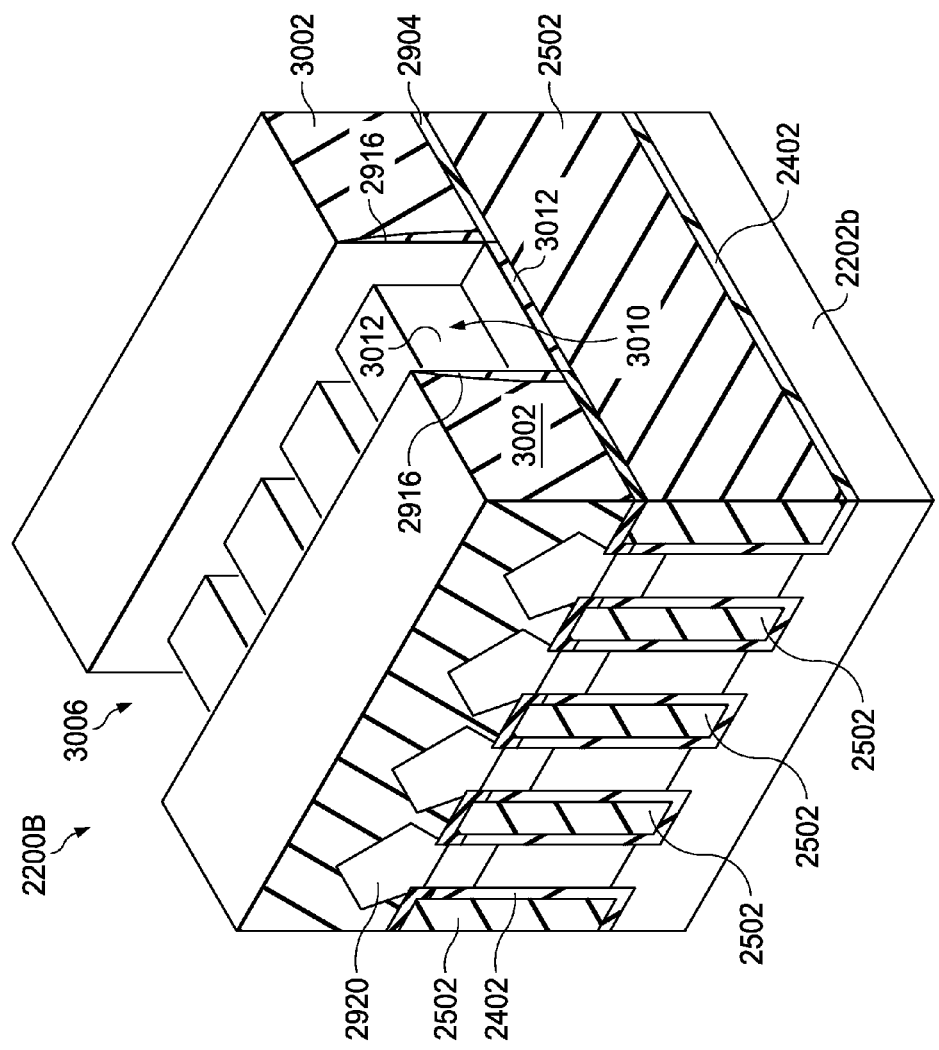
Figure 31A:
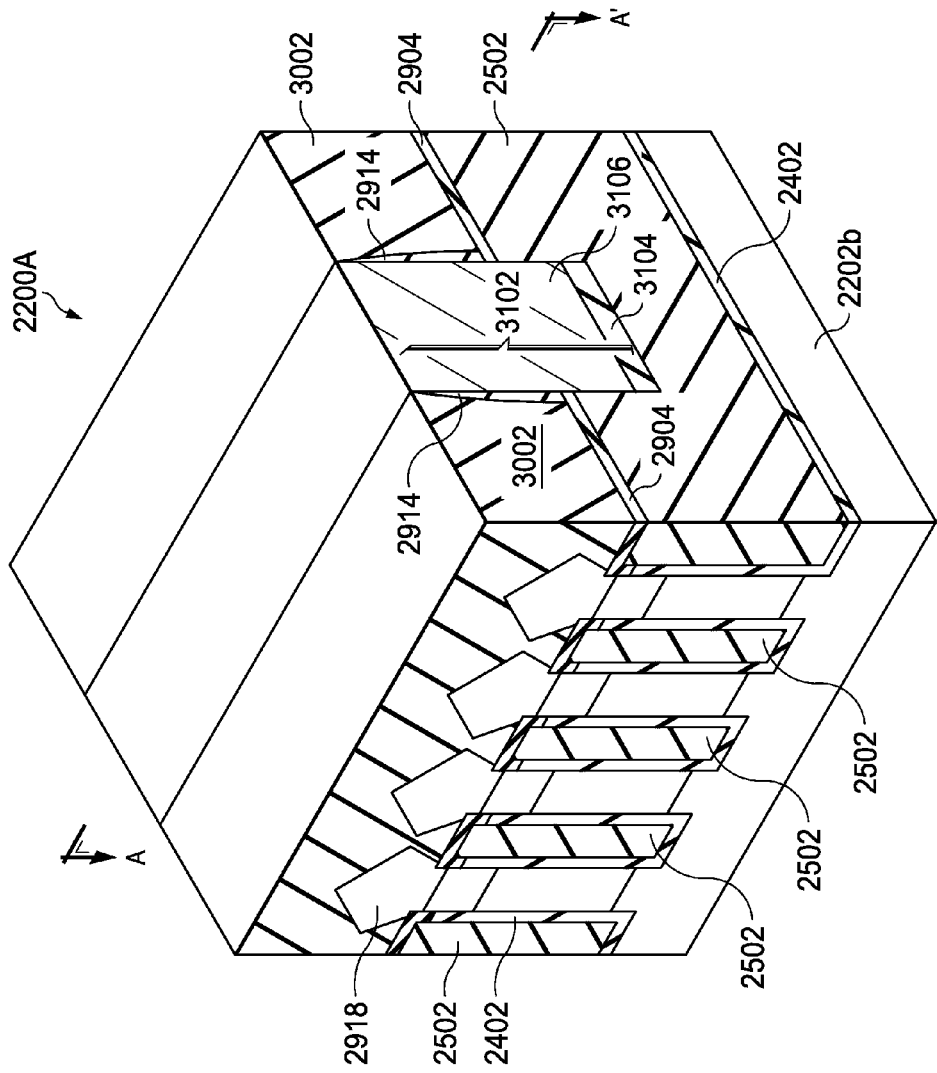
FIGS. 31C-31F illustrate cross-sectional views a semiconductor device, in accordance with some embodiments.

FIGS. 30A and 30B illustrate the formation of an interlayer dielectric (ILD) 3002 over the first source/drain regions 2918 and the second source/drain regions 2920. In an embodiment, the ILD 3002 may comprise silicon oxide, silicon nitride, the like, or a combination thereof. The ILD 3002 may be formed by CVD, a high density plasma (HDP), the like, or a combination thereof. Subsequently, the ILD 3002 may be planarized to be substantially coplanar with top surfaces of the first dummy gate electrode 2906 and the second dummy gate electrode 2912. In an embodiment, the ILD 3002 is planarized, for example, by using a CMP to remove portions of the ILD 3002. In other embodiments, other planarization techniques may be used, such as etching.

In some embodiments, a protective layer (not shown) may be conformally deposited over the first source/drain regions 2918 and the second source/drain regions 2920 to protect the first source/drain regions 2918 and the second source/drain regions 2920 during the subsequent formation of contacts through the ILD 3002 to the first source/drain regions 2918 and the second source/drain regions 2920. In an embodiment, the protective layer may comprise silicon nitride, silicon oxide, the like, or a combination thereof and is formed by plasma-enhanced CVD (PECVD), low-pressure CVD (LPCVD), atomic layer deposition (ALD), the like, or a combination thereof.

FIGS. 30A and 30B further illustrates removal of the first dummy gate stack 2902 and the second dummy gate stack 2908 and formation of a first channel opening 3004 and a second channel opening 3006, respectively, during step 2116 of the method 2100 (see FIG. 21). In the illustrated embodiment, the first channel opening 3004 exposes first channel regions 3008 of the first upper fins 2302u, and the second channel opening 3006 exposes a second channel regions 3010 of the second upper fins 2304u. In an embodiment, the first dummy gate electrode 2906 and the second dummy gate electrode 2912 are removed by an etch process that is selective to the material of the first dummy gate electrode 2906 and the second dummy gate electrode 2912. For example, if the first dummy gate electrode 2906 and the second dummy gate electrode 2912 comprise polysilicon, a dry etch using $NF_3$, $SF_6$, $Cl_2$, HBr, the like, or a combination thereof or a wet etch using $NH_4OH$, tetramethylammonium hydroxide (TMAH), the like, or a combination thereof may be used to remove the first dummy gate electrode 2906 and the second dummy gate electrode 2912.

Subsequently, portions of the dummy gate dielectric layer 2904 exposed in the first channel opening 3004 and the second channel opening 3006 are removed to expose the first channel regions 3008 of the first upper fins 2302u and the second channel regions 3010 of the second upper fins 2304u, respectively. For example, if the dummy gate dielectric layer 2904 comprises silicon oxide, wet etch using a diluted HF acid may be used to remove the portions of the dummy gate dielectric layer 2904.

FIGS. 30A and 30B further illustrate the formation of buried oxide regions 3014 in the first middle fins 2302m in accordance with an embodiment, at step 2118 of the method 2100 (see FIG. 21). Referring first to FIG. 30B, a second hard mask 3012 is formed over the second channel regions 3010 of the second upper fins 2304u before performing an oxidation process. The second hard mask 3012 protects the second channel regions 3010 of the second upper fins 2304u from undesired oxidation during the subsequent oxidation process. The second hard mask 3012 may be formed using the same materials and methods as the first hard mask 2504, and the description is not repeated herein.

Referring to FIG. 30A, portions of the STI regions 2502 that are exposed by the first channel opening 3004 are recessed to partially expose the first middle fins 2302m. In an embodiment, the STI regions 2502 are recessed by an etch process that is selective to the material of the STI regions 2502. The buried oxide regions 3014 are formed by performing an oxidation process to the multilayer substrate 2202. In an embodiment, the oxidation process is performed at a temperature from about 400° C. to about 600° C., at a pressure from about 1 atmosphere (atm) to about 20 atm, for a time from about 10 minutes (mins) to about 60 mins, and with $H_2O$ as a reaction gas. In the embodiment, the buried oxide regions 3014 are formed of $GeO_x$ or $SiGeO_x$ and may have a thickness $T_1$ (not illustrated in FIG. 30A, but illustrated in FIGS. 31C and 31D) between about 3 nm and about 10 nm.

As illustrated in FIG. 30A, the buried oxide regions 3014 are formed at the exposed sidewalls of the first middle fins 2302m. Due to the difference in oxidation rates between the first middle fins 2302m and the first upper fins 2302u, only the first middle fins 2302m are substantially oxidized. The buried oxide regions 3014 extend along the first middle fins 2302m between the first source/drain regions 2918. In the illustrated embodiment, each of the first fins 2302 has a pair of the buried oxide regions 3014 formed at both exposed sidewalls (see also FIGS. 31C and 31D). Each of the buried oxide regions 3014 in the pair also extends above and below a plane defined by a corresponding sidewall of each of the first fins 2302, thereby forming a convex structure that is partially embedded in the corresponding sidewall of each of the first fins 2302.

The buried oxide regions 3014 apply a stronger strain to the first channel regions 3008 than the first source/drain regions 2918 alone. In addition, the buried oxide regions 3014 narrow carrier transportation paths between the first fins 2302. Therefore, problems associated with high leakage current due to poor isolation may be reduced and/or eliminated.

Figure 31B:
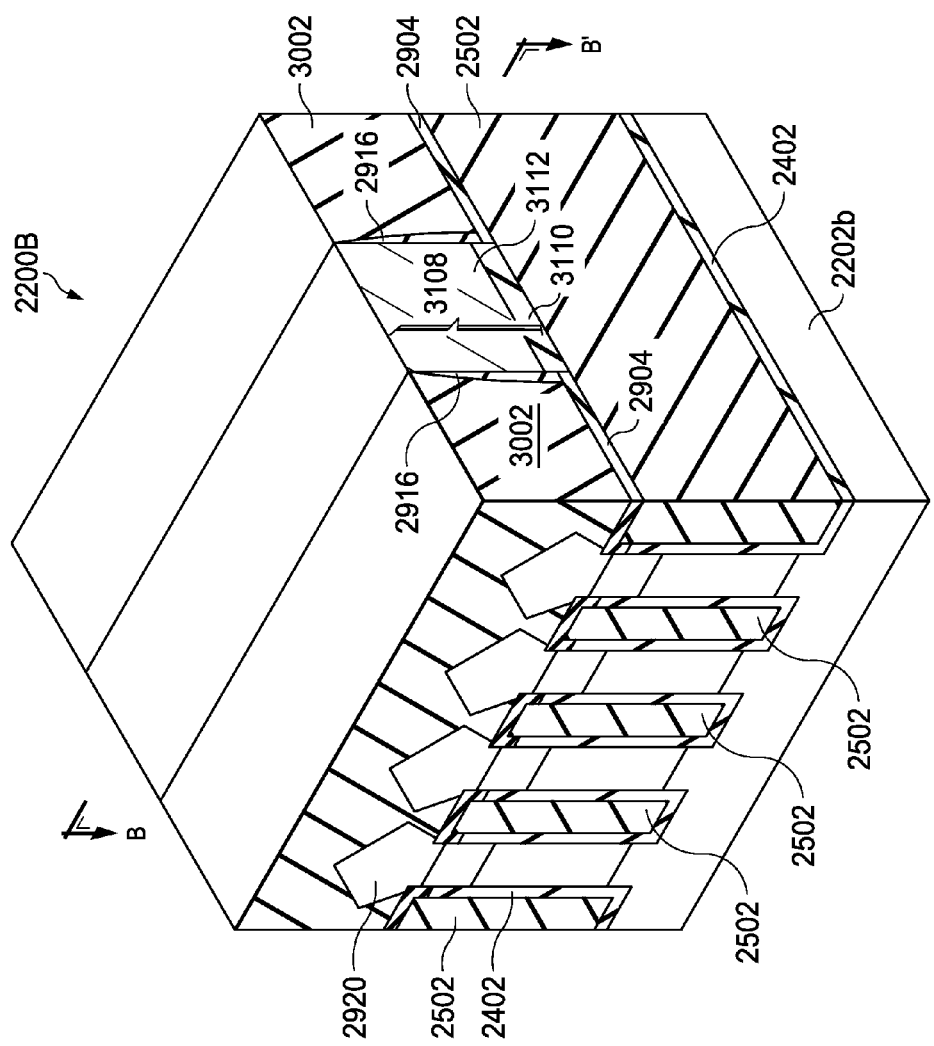
Figures 31E, 31F:
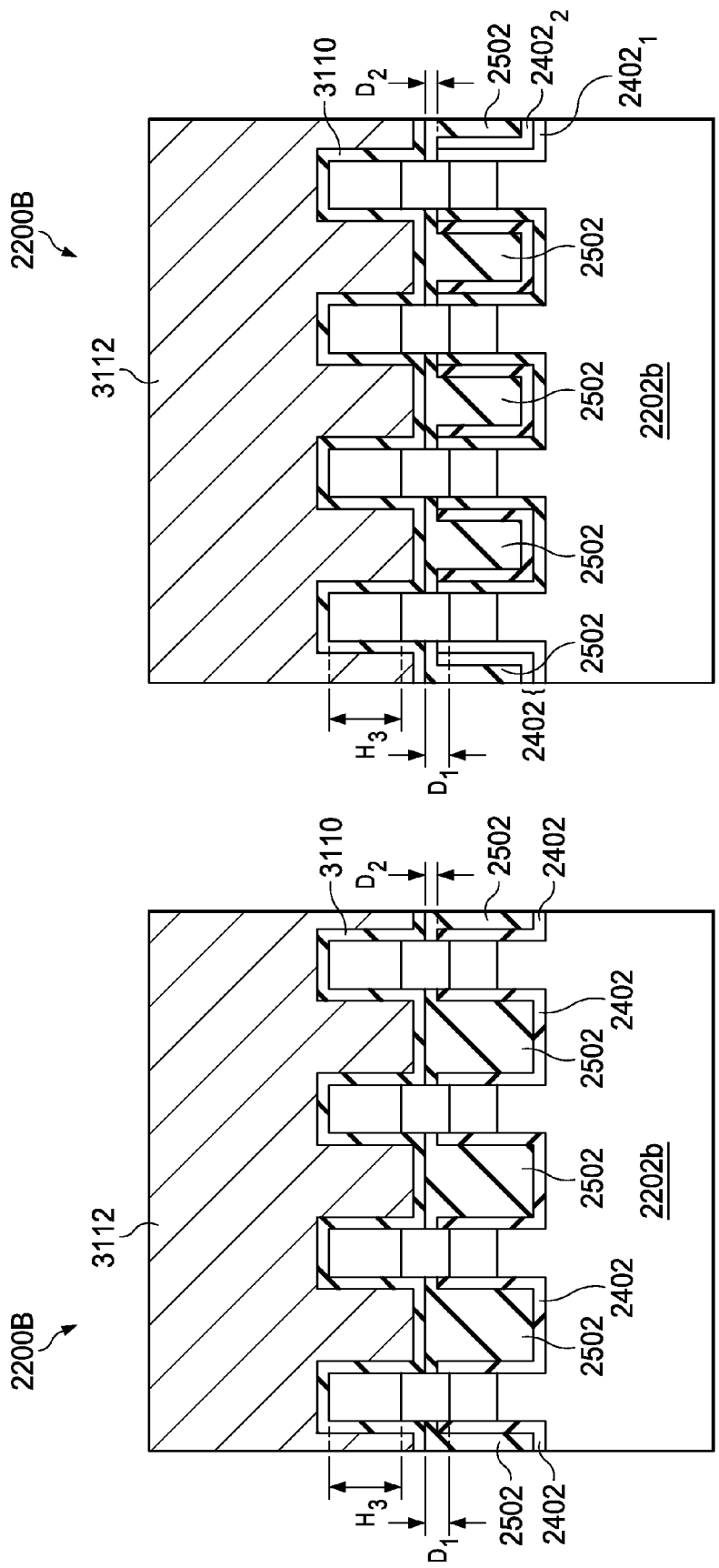

FIG. 31A illustrates the formation of a first gate stack 3102 comprising a first gate dielectric 3104 and a first gate electrode 3106 in the first channel opening 3004, at step 2120 of the method 2100 (see FIG. 21). FIG. 31B illustrates the formation of a second gate stack 3108 comprising a second gate dielectric 3110 and a second gate electrode 3112 in the second channel opening 3006, at step 2120 of the method 2100 (see FIG. 21). The first gate stack 3102 and the second gate stack 3108 may be formed using similar materials and methods as the first dummy gate stack 2902 and the second dummy gate stack 2908 described above with reference to FIGS. 29A and 29B, and the description is not repeated herein.

FIG. 31C illustrates a cross-section view (along the line AA' in FIG. 31A) of the NMOS FinFET 2200A with the liner layer 2402 having a single-layer structure in accordance with some embodiments. FIG. 31D illustrates a cross-section view (along the line AA' in FIG. 31A) of the NMOS FinFET 2200A with the liner layer 2402 having a dual-layer structure in accordance with some embodiments.

FIG. 31E illustrates a cross-section view (along the line BB' in FIG. 31B) of the PMOS FinFET 2200B with the liner layer 2402 having a single-layer structure in accordance with some embodiments. In the illustrated embodiment, a first distance $D_1$ between the upper surfaces of the second middle fins 2304m and the top surfaces of the STI regions 2502 is between about 5 nm and about 20 nm, and a second distance $D_2$ between the topmost surfaces of the liner layer 2402 and the top surfaces of the STI regions 2502 is between about 3 nm and about 10 nm. FIG. 31F illustrates a cross-section view (along the line BB' in FIG. 31B) of the PMOS FinFET 2200B with the liner layer 2402 having a dual-layer structure in accordance with some embodiments.

It is understood that the NMOS FinFET 2200A and the PMOS FinFET 2200B described above may undergo further processes to form various features such as contacts/vias, interconnect metal layers, dielectric layers, passivation layers, etc. The methods described above may help to improve isolation between adjacent fins, reduce or eliminate germanium diffusion along interfaces between fins and STI regions, and prevent or eliminate undesired oxidation of the fins. Thus, problems associated with high leakage current due to poor isolation, and mobility degradation due to diffusion may be avoided.

According to some embodiments, a semiconductor device comprises a fin having a first wall extending along a first plane. In some embodiments, the fin comprises a doped region, the doped region defining a first furrow on a first side of the first plane and a dielectric disposed within the first furrow. In some embodiments, the dielectric is in contact with the first furrow between a first end of the dielectric and a second end of the dielectric, the first end separated a first distance from the first plane.

According to some embodiments, a method of forming a semiconductor device comprises forming a doped region in a fin, the fin having a first wall extending along a first plane, and oxidizing the fin, such that the doped region defines a first furrow on a first side of the first plane, and such that a dielectric is on a first outer surface of the first furrow. In some embodiments, the method of forming a semiconductor device further comprises removing a portion of the dielectric, such that the dielectric is disposed within the first furrow and such that the dielectric is in contact with the first furrow between a first end of the dielectric and a second end of the dielectric. In some embodiments, the first end is separated a first distance from the first plane.

According to some embodiments, a semiconductor device comprises a fin comprising silicon having a first wall extending along a first plane. In some embodiments, the fin comprises a doped region comprising germanium, the doped region defining a first furrow on a first side of the first plane, and a dielectric disposed within the first furrow, the dielectric comprising silicon, germanium and oxygen. In some embodiments, the dielectric is in contact with the first furrow between a first end of the dielectric and a second end of the dielectric. In some embodiments, the first end is separated a first distance from the first plane.

In an embodiment, a semiconductor device comprises a first fin formed on a substrate, and oxide regions formed on opposing sidewalls of the first fin, the oxide regions extending toward each other such that a portion of the first fin between the oxide regions is narrower than a portion of the first fin above the oxide regions. The semiconductor device further comprises a first shallow trench isolation (STI) region along a first sidewall of the opposing sidewalls, lowest portions of the oxide regions being higher than a topmost surface of the first STI region, and one or more liner layers interposed between the first fin and the first STI region.

In another embodiment, a method of forming a semiconductor device, the method comprises providing a substrate, forming a plurality of trenches in the substrate, portions of the substrate between neighboring trenches forming fins, forming one or more liner layers along sidewalls of the plurality of trenches, forming a first dielectric material over the one or more liner layers, and removing a first portion of the one or more liner layers and a first portion of the first dielectric material to expose upper portions of the fins. The method further comprises forming dummy gates over channel regions of the fins, forming a second dielectric material over the upper portions of the fins, the dummy gates being interposed between portions of the second dielectric material, removing the dummy gates to form openings in the second dielectric material, the openings exposing portions of the fins, and oxidizing exposed portions of the fins, thereby forming oxide regions on sidewalls of the fins, each oxide region extending above and below a plane defined by a corresponding sidewall.

In yet another embodiment, a method of forming a semiconductor device, the method comprises forming a first fin on a substrate, the first fin having a first upper portion, a first lower portion, and a first middle portion interposed between the first upper portion and the first lower portion, forming one or more liner layers over a first sidewall of the first fin, and forming a first shallow trench isolation (STI) region over the first sidewall of the first fin, the one or more liner layers being interposed between the first STI region and the first fin. The method further comprises recessing the one or more liner layers and the first STI region to expose portions of the first upper portion and the first middle portion of the first fin, and forming oxide regions on opposing sidewalls of the first middle portion of the first fin, the oxide regions extending toward each other such that a portion of the first middle portion of the first fin between the oxide regions is narrower than the first upper portion of the first fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and elementBor two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method of forming a semiconductor device, the method comprising:
    forming a plurality of trenches in a substrate, portions of the substrate between neighboring trenches forming fins;
    forming one or more liner layers along sidewalls of the plurality of trenches;
    forming a first dielectric material over the one or more liner layers;
    removing a first portion of the one or more liner layers and a first portion of the first dielectric material to expose upper portions of the fins;
    forming dummy gates over channel regions of the fins;
    forming a second dielectric material over the upper portions of the fins, the dummy gates being interposed between portions of the second dielectric material;
    removing the dummy gates to form openings in the second dielectric material, the openings exposing portions of the fins; and
    oxidizing exposed portions of the fins, thereby forming oxide regions on sidewalls of the fins, each oxide region extending above and below a plane defined by a corresponding sidewall.

2. The method of claim 1, wherein a thickness of the oxide regions is between about 3nm and about 10nm.

3. The method of claim 1, wherein a first fin of the fins comprises a first upper portion, a first lower portion, and a first middle portion interposed between the first upper portion and the first lower portion, the first upper portion and a first lower portion being formed of a first semiconductor material and the first middle portion being formed of a second semiconductor material, the first semiconductor material being different from the second semiconductor material.

4. The method of claim 1, wherein the oxide regions comprise $GeO_x$ or $SiGeO_x$.

5. The method of claim 1, wherein the one or more liner layers comprise a first liner layer and a second liner layer over the first liner layer, the second liner layer comprising silicon nitride or aluminum oxide, and the first liner layer comprising silicon or silicon oxynitride.

6. The method of claim 5, wherein the first liner layer has a first thickness between about 10 Å and about 30 Å, and wherein the second liner layer has a second thickness between about 20 Å and about 60 Å.

7. A method of forming a semiconductor device, the method comprising:
forming a first fin on a substrate, the first fin having a first upper portion, a first lower portion, and a first middle portion interposed between the first upper portion and the first lower portion;
forming one or more liner layers on a first sidewall of the first fin;
forming a first shallow trench isolation (STI) region adjacent the first sidewall of the first fin, the one or more liner layers being interposed between the first STI region and the first fin;
recessing the one or more liner layers and the first STI region to expose portions of the first upper portion and the first middle portion of the first fin; and
forming oxide regions on opposing sidewalls of the first middle portion of the first fin, the oxide regions extending toward each other such that a portion of the first middle portion of the first fin between the oxide regions is narrower than the first upper portion of the first fin.

8. The method of claim 7, further comprising:
forming a second fin on the substrate, the second fin having a second upper portion, a second lower portion, and a second middle portion interposed between the second upper portion and the second lower portion;
forming the one or more liner layers on a second sidewall of the second fin;
forming a second STI region adjacent a second sidewall of the second fin, the one or more liner layers being interposed between the second STI region and the second fin; and
replacing a portion of the second upper portion of the second fin with a first semiconductor material, the first semiconductor material being different from a second semiconductor material of the second upper portion of the second fin.

9. The method of claim 8, wherein the first upper portion of the first fin, the first lower portion of the first fin, the second upper portion of the second fin and the second lower portion of the second fin comprise silicon, and wherein the first middle portion of the first fin and the second middle portion of the second fin comprise silicon germanium.

10. The method of claim 8, wherein the first semiconductor material is silicon and the second semiconductor material is silicon germanium.

11. The method of claim 7, wherein the oxide regions comprise $GeO_x$ or $SiGeO_x$.

12. A method of forming a semiconductor device, the method comprising:
patterning a substrate to form a first fin and a second fin thereon;
forming one or more liner layers on a first sidewall of the first fin and on a second sidewall of the second fin;
forming a first dielectric material over the one or more liner layers;
patterning the one or more liner layers and the first dielectric material to expose the first fin and the second fin;
forming a first dummy gate over the first fin;
forming a second dummy gate over the second fin;
forming a second dielectric material over the first fin and the second fin, a portion of the second dielectric material being interposed between the first dummy gate and the second dummy gate;
removing the first dummy gate to form a first opening in the second dielectric material, the first opening exposing a first portion of the first fin;
removing the second dummy gate to form a second opening in the second dielectric material, the second opening exposing a second portion of the second fin;
oxidizing the first portion of the first fin to form a first oxide region on a first sidewalls of the first portion and a second oxide region on a second sidewall of the first portion, the first sidewall being opposite of the second sidewall, the first oxide region and the second oxide region extending into the first portion of the first fin; and
replacing an upper portion of the second portion of the second fin.

13. The method of claim 12, wherein replacing the upper portion of the second portion of the second fin comprises:
removing the upper portion of the second portion of the second fin to form a recess in the second fin; and
epitaxially growing a first semiconductor material in the recess, the first semiconductor material being different from a second semiconductor material of the upper portion of the second portion of the second fin.

14. The method of claim 12, wherein the first oxide region and the second oxide region contact the one or more liner layers.

15. The method of claim 12, further comprising:
forming a first gate in the first opening; and
forming a second gate in the second opening.

16. The method of claim 15, wherein the first oxide region and the second oxide region contact the first gate.

17. The method of claim 15, wherein the one or more liner layers are separated from the second gate.

18. The method of claim 12, wherein topmost surfaces of the first oxide region and the second oxide region are lower than a topmost surface of the first fin.

19. The method of claim 12, further comprising forming a hard mask layer over the second portion of the second fin before oxidizing the first portion of the first fin.

20. The method of claim 12, wherein oxidizing the first portion of the first fin comprises exposing the first portion of the first fin to $H_2O$ vapor for a period from about 10 mins to about 60 mins at a temperature from about 400 °C. to about 600 °C. and at a pressure from about 1 atm to about 20 atm.

* * * * *